United States Patent
Murakami et al.

[11] Patent Number: 5,969,531
[45] Date of Patent: Oct. 19, 1999

[54] INSPECTION APPARATUS FOR INSPECTING PERFORMANCE OF STRUCTURE BY INSERTING MEASURING ELEMENT THROUGH GAP FORMED THEREIN

[75] Inventors: Shin Murakami, Hachiouji; Tadashi Munakata, Tokyo; Norihito Togashi, Yokohama; Satoshi Suzuki, Tokyo; Sueyoshi Mizuno, Fuchu; Yoshikata Kobayashi, Hachiouji; Satoshi Irie, Kawasaki; Masanori Sotodate, Hadano; Katsune Zaitsu; Shinji Takahashi, both of Yokohama; Hideyuki Shimada, Tokyo, all of Japan

[73] Assignee: Kabushiki Kaisha Toshiba, Kawasaki, Japan

[21] Appl. No.: 08/811,961

[22] Filed: Mar. 5, 1997

[30] Foreign Application Priority Data

Mar. 5, 1996 [JP] Japan .................................. 8-047823
Dec. 26, 1996 [JP] Japan .................................. 8-348159

[51] Int. Cl.$^6$ ............................. G01R 31/06; G01R 27/26
[52] U.S. Cl. ............................ 324/545; 324/772; 324/687
[58] Field of Search .................................. 324/772, 545, 324/686, 687

[56] References Cited

U.S. PATENT DOCUMENTS

| 4,889,000 | 12/1989 | Jaafar et al. | 73/865.8 |
| 4,901,572 | 2/1990 | Suyama | 73/572 |
| 5,682,102 | 10/1997 | Takahashi et al. | 324/545 |

FOREIGN PATENT DOCUMENTS 0 684 483 A2 11/1995 European Pat. Off. .
9-51658 2/1997 Japan .

OTHER PUBLICATIONS

The American Society of Mechanical Engineers, 93-JPGC-PWR-26, pp. 1-6, Oct. 17-22, Lloyd R. Brown, et al., "Montana Power Company's Experience With Leaks In Water-Cooled Stator Windings".

Electric Power Research Institute, GER-3751A, pp. 1-13, Jun. 5-6, 1995, Bruce Faulk, et al., "Diagnosing And Repairing Water Leaks In Stator Windings".

*Primary Examiner*—Glenn W. Brown
*Attorney, Agent, or Firm*—Oblon, Spivak, McClelland, Maier & Neustadt, P.C.

[57] ABSTRACT

The inspection apparatus for inspecting performance of a structure such as stator windings of an electric rotating machine of the invention comprises a probe including a measuring element, an arm unit and a cylinder face circumferential moving apparatus. The arm unit has an arm link section supporting the probe (mainly comprising a leading end link assembly and an arm posture keeping mechanism), an arm housing section (mainly comprising a guide rail) regarding driving of this arm link section, and an arm driving mechanism. The arm driving mechanism causes the leading end link assembly to project from the guide rail at an angle toward a measuring position side of the stator windings relative to the axial direction of the rotor unit, while causing the arm link section to travel along the guide rail. The arm posture keeping mechanism is provided with a link wire and a spring, and maintains a straight arm posture of the leading end link assembly after projection from the guide rail.

39 Claims, 29 Drawing Sheets

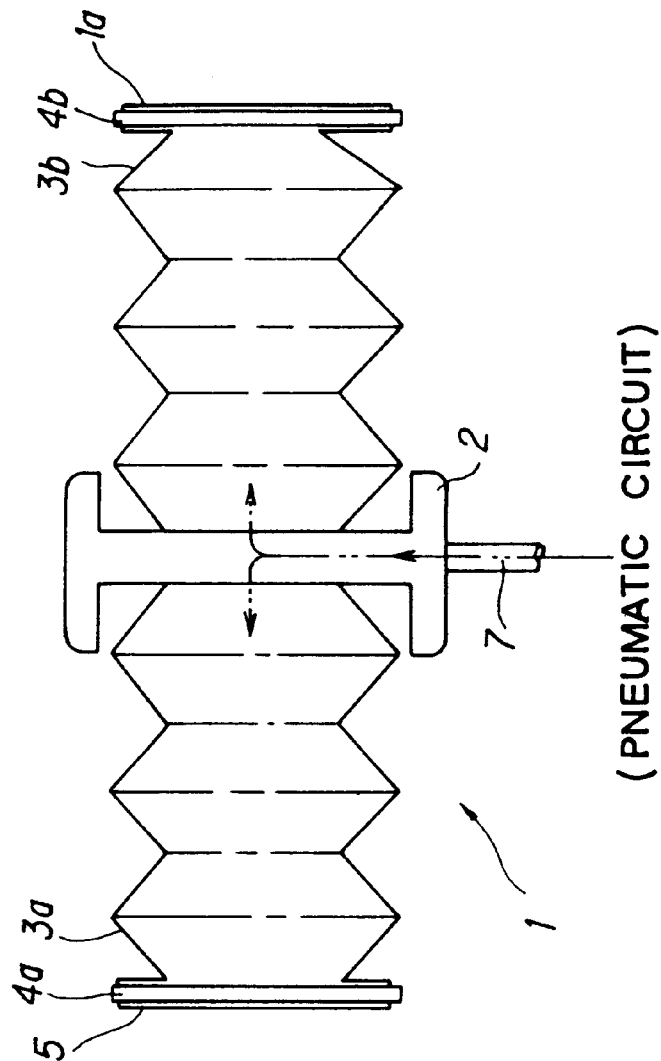
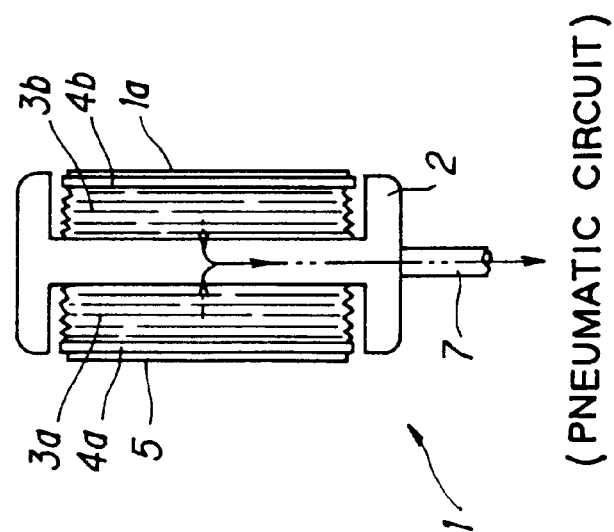
FIG. 4B
FIG. 4A (PNEUMATIC CIRCUIT)

INSPECTION APPARATUS FOR INSPECTING PERFORMANCE OF STRUCTURE BY INSERTING MEASURING ELEMENT THROUGH GAP FORMED THEREIN

BACKGROUND OF THE INVENTION

The present invention relates to an inspection apparatus using a measuring element such as an inspection apparatus of a stator winding of an electric rotating machine, an arm unit and a cylinder face circumferential moving apparatus. More particularly, the present invention relates to an arm construction and a traveling mechanism suitable for an inspection apparatus for measuring electrostatic capacity of a stator winding in a state in which a rotor is inserted.

There is known in general a type of electric rotating machine having a water-cooled stator winding. Examples of this type are illustrated in FIGS. 29 to 31.

The electric rotating machine shown in FIG. 29 comprises a stator unit 120 comprising a stator 104 formed by inserting and fixing a stator winding (an upper stator winding 103a and a lower stator winding 103b in FIG. 29) in a stator iron core 102 attached to a stator frame 101, and a rotor unit 130 arranged oppositely to this stator unit 120 in a non-contact manner, the rotor unit having a rotor 121, protecting ring 122 and a rotation shaft 123.

Among these components, the stator winding 103 is formed, as shown in FIGS. 30 and 31, by gathering a plurality of strands 105, covering the outside thereof with an insulating layer 106 such as an insulating tape or an epoxy resin, and attaching clips 107 to each end of the individual strands 105. Each of the strands 105 is provided with a hollow hole 108 through which cooling water can flow. These hollow holes 108 communicate to an insulating connection pipe (not shown) and a cooling water duct 110 outside the stator frame 101 through a water inlet port or a water inlet port 109 of the clip 107. Cooling water from the cooling water duct 110 is therefore supplied through the insulating connection pipe and the water inlet port 109 of the clip 107 to the hollow hole 108, and cooling water is discharged through the water inlet port 109 of the clip 107 to the cooling water duct 110.

The individual strands 105, the clip 107 and the insulating connection pipe thus forming a path for cooling water are connected by brazing, and the outside of braze-connected portions is covered with an insulating layer 106 in a manner as described above. The braze-connected portions covered with the insulating layer 106 is subjected to various leakage tests after a strict quality control with a view to preventing leakage of cooling water and thus to assuring reliability. To avoid such inconveniences as partial peeling of the braze-connected portions or pit corrosion caused by vibration, heat cycles and corrosion through service for many years, a coil pressurizing test or a vacuum drop test is usually applied during a periodical inspection to check a change in pressure and thus to confirm the non-leakage state.

However, when cooling water leaks from the connecting portion between the strands 105 and the clip 107, cooling water permeates through the insulating layer 106 at the portion covered with an insulating tape by capillary action, and particularly when cooling water permeation reaches the stator iron core 102, an inconvenience known as a ground-fault may occur between the stator winding 103 and the ground. It is therefore believed to be important to pay sufficient attention to permeation of cooling water into the insulating layer 106 and check it up as early as possible.

As a method for such a checkup, there is proposed a method of inspection, paying attention to the difference in specific inductive capacity between the insulating layer 106 and cooling water, which comprises determining a corroded stator winding resulting from absorption of water by the insulating layer caused by cooling water leakage by measuring electrostatic capacity through application of a measuring element to measuring positions P and P (see FIG. 29) of the stator winding.

In the checkup method of determining the corroded stator winding resulting from absorption of water by the insulating layer caused by cooling water leakage, however, the measuring position of the stator winding to which the measuring element is applied is located at a depth in the electric rotating machine or the human hand is unreachable in the state as it is. It is therefore necessary to perform an inspection by pulling out the rotor unit from the stator unit.

The operation of thus pulling out the rotor unit requires much labor for dismantling, takes much time, and is not always efficient. Furthermore, because inspection of the stator winding including the operation for pulling out the rotor unit is carried out by stopping the electric rotating machine, a longer inspection period leads to a higher cost.

The inspection carried out after removal of the rotor unit also requires direct use of human power in pressing operation of the measuring element, and is not therefore always efficient.

Because, for example, the measuring element has usually a rectangular shape, there may be a change in the effective area of the measuring element, depending upon the direction of pressing, resulting in easy occurrence of fluctuations of measured data. In order to obtain satisfactory measured data, it is necessary to press the measuring element while causing the same to follow the curved and other surfaces of the stator winding, and it is difficult to carry out this pressing operation within a limited space.

SUMMARY OF THE INVENTION

Accordingly, the present invention is to solve these conventional problems, and has an object to relatively easily and accurately carry out an inspection of the stator winding without pulling out the rotor unit from the stator unit, and complete this inspection operation in a short period of time.

Another object of the present invention is to construct and provide at a low cost a highly practicable equipment configuration suitable for inspection of a stator winding of an electric rotating machine.

Further another object of the present invention is to carry out relatively simply and accurately the pressing operation of the measuring element.

The above objects can be achieved according to the present invention, in one aspect providing by an inspection apparatus for inspecting performance of a structure at a measuring position placed therein through a gap formed in the structure, said inspection apparatus comprising a measuring element for measuring data associated with performance of the structure, an arm body for supporting the measuring element, and means for inserting the measuring element supported by the arm body through the gap along an arm axial direction of the arm body by continuously operation, thereby the measuring element being set at the measuring position.

In preferred embodiments, the arm body is an arm link assembly formed by connecting a plurality of links in the arm axial direction.

The inserting means comprises an arm moving element for causing the arm link assembly to travel in the gap and to project at an angle directed toward the measuring position relative to the direction of the travel while causing the travel of the arm link assembly and an arm posture keeping element for keeping a linear arm posture of the arm link assembly caused to project by the arm moving element.

The moving element comprises a guide for guiding the travel and projection of the arm link assembly and a driving mechanism for driving the arm link assembly along the guide. The driving mechanism is a sliding mechanism for sliding the arm like assembly in the arm axial direction. The sliding mechanism is a feed screw mechanism.

Adjacent two links of the links are rockable between an angle depending upon the linear arm posture and a prescribed angle limited toward one side of the linear arm posture mutually around a connecting center of the other link.

The arm posture keeping element includes a cable-like member being secured to a leading end side link of the links through one side of each of connecting shafts of the links at one end of the cable-like member, an elastic member connected to the other end of the cable-like member, the elastic member being secured to a trailing end side link of the links.

The arm posture keeping element includes a leaf spring being secured to a leading end side link at one end of the leaf spring and being secured to a trailing end side link of the links through one side of each of connecting shafts thereof at the other end of the leaf spring.

The arm posture keeping element includes a plurality of pulleys rotatably connected to each of the links so as to constrain a rotation angle of a trailing end side pulley of the pulleys and limit a rotation angle of a leading end side pulley of the pulleys to a prescribed angle relative to the leading end side link and a plurality of belts connecting mutually adjacent two pulleys of the pulleys.

Each of the links form a frame.

The structure is an electric rotating machine comprising a rotor body of cylindrical structure and a stator body covering an outer peripheral portion of the rotor body in a non-contact fashion, the stator body including a stator winding formed with an insulation and arranged radially outward of the rotor body and a stator core which supports the stator winding, the gap being located between the rotor body and stator body, said measuring position being placed on the stator winding, said arm body being attached to the rotor body so that the arm axial direction becomes an axial direction of the rotor body, and said measuring element being an element for measuring electrostatic capacity of the stator winding as the data.

An inspection apparatus may further comprise a cylinder face circumferential moving apparatus for causing the measuring element supported by the arm body to freely travel in a circumferential direction of the rotor body.

The cylinder face circumferential moving apparatus comprises a belt member having a toothed belt attachable in the circumferential direction of the rotor body, a pulley engaging with the toothed belt, a drive which rotatably drives the pulley, and a cable-like member attachable in the circumferential direction, the cable-like member being detachably wound on the rotor body so as to press the drive against the belt member and the arm body is attached to the drive. The belt member has a belt and a hoist capable of hoisting the belt, the belt being attached to both ends of the toothed belt and the belt being hoisted by the hoist, thereby the toothed belt hoisted and secured onto the rotor. The belt is attached to one end of the cable-like member, said hoist being attached to the other end of the cable-like member. The cable-like member is provided with a tension regulator.

The cylinder face circumferentiial moving apparatus comprise a roller chain being detachably wound the rotor along the circumferential direction of the rotor body, a sprocket engaging with the roller chain, and a drive for rotatably driving the sprockets engaging with the roller chain, the drive being arranged on the roller chain, the cable-like member being wound on the rotor body so as to press the drive against the roller chain, the arm body being attached to the drive.

An inspection apparatus may further comprise means for setting origins for the axial position of the rotor body in the arm body and for the circumferential position of the rotor body in the cylinder face circumferential moving apparatus.

An inspection apparatus may further comprise a probe body having a base to be attached to the arm body, an expansible bellow attached to at least one side of the base and means for supplying and discharging air into and from the expansible bellow, and the measuring element being attached to the expansible bellow.

The arm body is a rod supporting the probe body.

The inserting means includes a traveling system for causing the measuring element to travel in the axial direction of the rotor body and positioning the measuring element at the measuring position of the stator winding, said traveling system including a driving mechanism having a servo motor and control means which conducts so that a winding of the servo motor is in a non-excited state during the measurement of the electrostatic capacity. The control means is provided with means for conducting control so that a rotation angle of the servo motor is in a non-detection state during the measurement of the electrostatic capacity.

The arm posture keeping element includes an element for keeping a prescribed angle of a base posture after the projection of the measuring element relative to the arm posture of the arm link assembly.

The structure is an electric rotating machine comprising a rotor body of cylindrical structure and a stator body covering an outer peripheral portion of the rotor body in a non-contact fashion, the stator body including a stator winding formed with an insulation and arranged radially outward of the rotor body and a stator core which supports the stator winding, the gap being located between the rotor body and stator body, said measuring position being placed on the stator winding, said arm like assembly being attached to the rotor body so that the arm axial direction becomes an axial direction of the rotor body, and said measuring element being a element for measuring electrostatic capacity of the stator winding as the data.

The arm moving means includes means for detecting data associated with a winding width in the radial direction of the stator winding when the arm link assembly travels and projects under the action of the arm moving element and means for specifying the measuring position of the stator winding based on the detected data.

The arm moving element includes means for positioning the measuring element at a desired position in the radial direction of the stator winding.

The cylinder face circumferential moving apparatus includes means for determining a insertion position of the measuring element in the circumferential direction of the rotor body.

The cylinder face circumferential moving apparatus includes means for limiting circumferential travel of the measuring element supported by the arm body on the basis of the state of arrangement of the measuring element relative to the arm link assembly.

The bellow is a plurality of bellows and said probe body has a cover covering the measuring element upon contraction of the bellows.

The measuring element is made of a copper foil being applied to one surface of a cushion material, the other surface of the cushion material is covered with a copper foil for grounding, and said probe body is attached through the copper foil for grounding.

An inspection apparatus may further comprise means for alternately changing each of the measuring elements attached through the expansible bellow to both sides of the base.

The inserting means includes means for causing the probe body supported by the rod to freely slide in the axial direction and the radial direction of the electric rotating machine, and means for positioning the probe body supported by the rod rockably in the circumferential direction of the electric rotating machine.

The rod is a bar rockably supporting the probe body.

An inspection apparatus may further comprise means for measuring a data in a non-contact state with the stator body as an initial value by the measuring element.

An inspection apparatus may further comprise means for discharging charge of the measuring element before the measurement of the electrostatic capacity.

The measuring position is selected from an exposed portion extending from the iron core end of the stator winding to outside the machine except for a portion subjected to a corona preventing treatment of the stator winding.

An inspection apparatus may further comprise means for measuring resistance value regarding a contact state of the measuring element with the stator winding as data for evaluation of the electrostatic capacity.

An inspection apparatus may further comprise means for automatically the measuring position of the stator winding during the measurement of the resistance value.

The measuring element has a measuring frequency of approximately 1 kHz.

In the inspection apparatus of this present invention, as described above in detail, while causing the arm link assembly to travel in a prescribed direction relative to the structure (for example, in the axial direction of the rotor unit), the arm link assembly is caused to project at an angle toward the measuring position side (for example, the gap of the stator windings) relative to this direction. The arm posture of the thus projecting arm link assembly is kept linear. Therefore, positioning to a prescribed position (for example, the gap of the stator windings) which would be unreachable without flexing in the middle, in a limited space of service, can be accomplished only by sliding drive of the arm link assembly, i.e., by a simple operation of a degree of freedom of 1.

This effect displays its full merit when the invention is applied in an inspection apparatus of stator windings of an electric rotating machine. In this case, it is possible to easily and accurately carry out inspection of the stator windings without the necessity of removing the rotor unit from the stator unit, and complete the inspecting operation in a short period of time. It is thus possible to simply achieve an inspection apparatus of a high practical merit at the relatively low cost.

BRIEF DESCRIPTION OF THE DRAWINGS

The accompany drawings which are incorporated in and constitute a part of this specification illustrate embodiments of the present invention and together with the description, serve to explain the principles of the present invention, in which:

FIGS. 4A and 4B are schematic side views illustrating operation of a probe;

DESCRIPTION OF THE PREFERRED EMBODIMENTS

Figure 1:
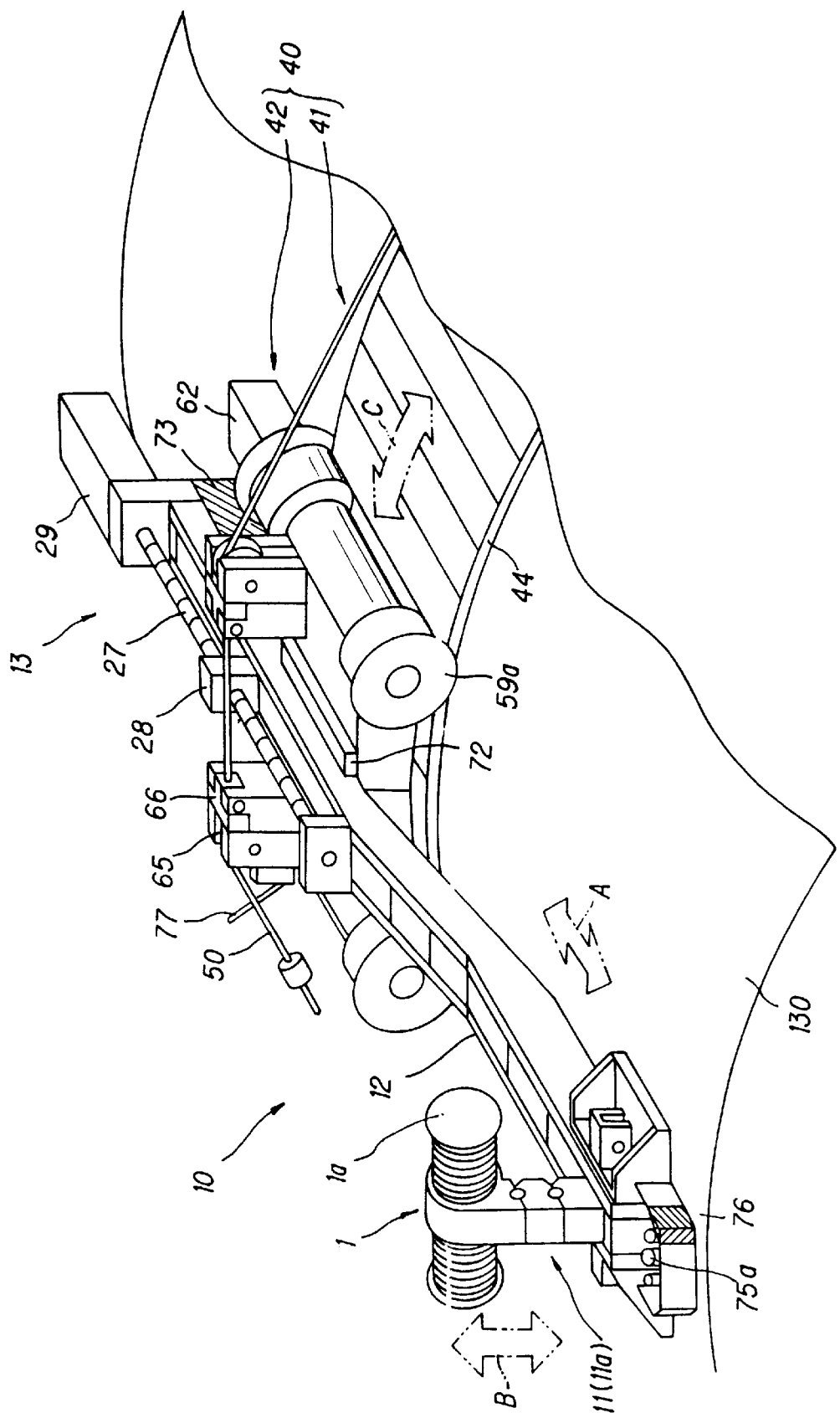
FIG. 1 is a schematic perspective view illustrating a whole configuration of the inspection apparatus of an electric rotating machine of a first embodiment.

Preferred embodiments of the present invention will be described with reference to the drawings below.

FIRST EMBODIMENT

Now, a first embodiment of the present invention will be described below with reference to FIGS. 1 to 10. This embodiment is based on an application of the inspection apparatus using a measuring element, the arm unit and the cylinder face circumferential moving apparatus of the present invention to an inspection apparatus (electrostatic capacity measuring apparatus) of a stator winding of an electric rotating machine. As the electric rotating machine is almost identical with a conventional one, description of an outline thereof is omitted here, the same reference numerals being assigned to corresponding components.

Figure 2:
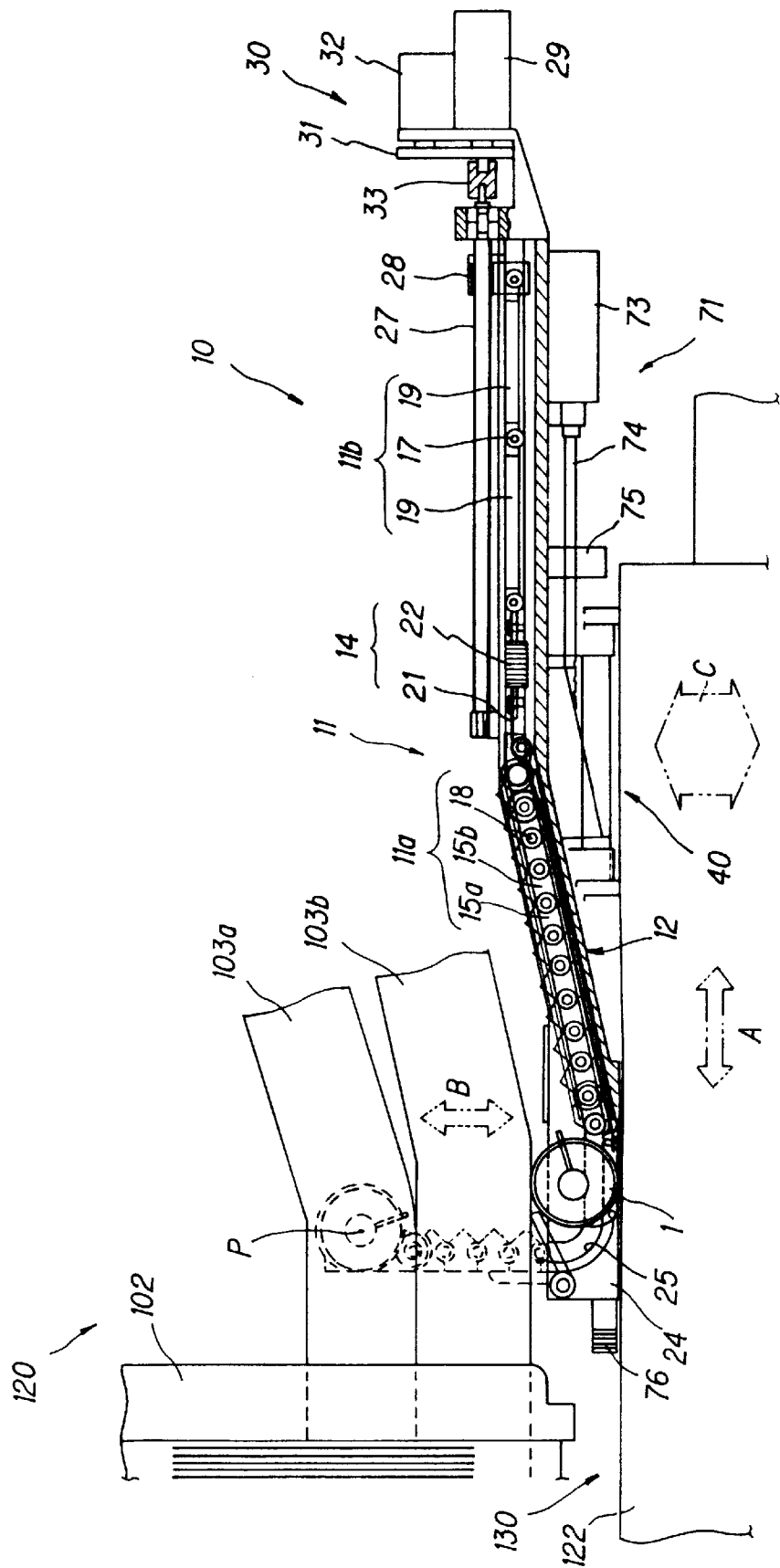
FIG. 2 is a schematic side view illustrating a whole configuration and operations thereof as a whole of the inspection apparatus of a stator winding of an electric rotating machine.

The perspective view of FIG. 1 and the sectional view of FIG. 2 illustrate a whole construction of the inspection apparatus of a stator winding of an electric rotating machine (hereinafter simply referred to as the "inspection apparatus").

The inspection apparatus shown in these drawings is to move and position a measuring element 1a for measuring electrostatic capacity from a gap between a rotor unit 130 and a stator unit 120 to a measuring position P of a stator winding 103, and comprises a probe 1 in which the measuring element 1a is arranged, an arm unit 10 slidably supporting this probe 1, a cylinder face circumferential moving apparatus (hereinafter simply referred to as the "moving apparatus") 40 rotatably and slidably supporting the arm unit 10, and a positional control system 70 for positional control of the arm unit 10 and the moving apparatus 40.

Now, an outline of the probe 1 will be described below with reference to the schematic sectional view shown in FIG. 3 and the operational diagram shown in FIG. 4, in addition to FIGS. 1 and 2.

Figure 3:
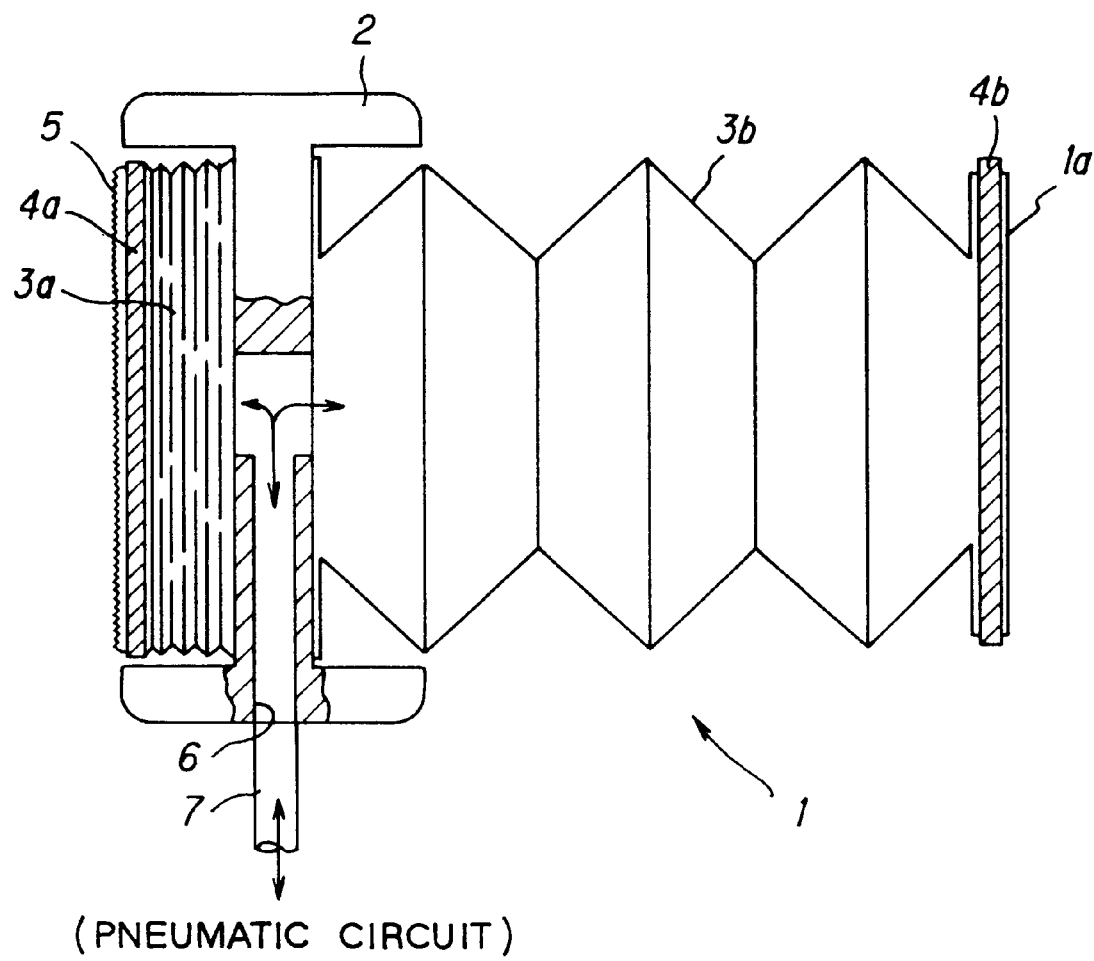
FIG. 3 is a schematic sectional view of a probe.

As shown in FIG. 3, the probe 1 has a base 2 forming a body to be attached to the arm unit 10. Expansible bellows 3a and 3b are attached to two sides with the axis of the base 2 in between, in a direction at right angles to the axial direction. An antiskid material 5 is attached to one of the sides of the base 2 and the circular-shaped measuring element 1a is attached to the other of the sides of the base 2, through cushions 4a and 4b attached to respective outer plates of the two bellows 3a and 3b. An air path 6 communicating spatially to air chambers of the two bellows 3a and 3b is provided in the base 2, and this air path 6 is connected to a pneumatic circuit (pneumatic source) not shown through an air piping 7 attached to the base 2.

During non-measuring time such as upon guiding, for example, to a measuring position P (see FIG. 15) of the stator winding 103, the probe 1 houses the bellows 3a and 3b in the base 2. During measurement of the stator winding 103, as shown in FIG. 4B, the probe 1 presses the measuring element 1a against the surface (measuring position P) of the stator winding 103 by sending air from the pneumatic circuit through the air piping 7 to the air path 6 of the base 2, and moving the antiskid material 5 and the measuring element 1a in directions opposite to each other through expansion of the bellows 3a and 3b. The pressing force of the antiskid material 5 and the measuring element 1a is kept constant by adjusting the pneumatic pressure of the pneumatic circuit. Upon completion of the measurement in this pressing state, the probe 1 houses the bellows 3a and 3b into the base 2, as shown in FIG. 4B, by absorbing air by means of the pneumatic circuit in the reverse sequent to the above.

Now, an outline of the arm unit 10 will be described below with reference to FIGS. 5 to 7, in addition to FIGS. 1 and 2.

As shown in FIGS. 1 and 2, the arm unit 10 comprises an arm link section (forming an arm link assembly and arm posture keeping means of the present invention) 11 to which the probe 1 is attached, an arm housing section (forming a guide member of arm traveling means of the present invention) 12 which slidably houses the arm link section 11 together with the probe 1, and guides the leading end of the arm link section 11 so that the same projects at an angle toward the measuring position P side specified of the stator winding 103, and an arm driving mechanism (forming a driving mechanism of the arm traveling means of the present invention) 13 which sliding-drives the arm link section 11 in the axial direction of the rotor unit 130 relative to the arm housing section 12.

As shown in FIG. 2, the arm link section 11 comprises link assembly different for the leading end and the trailing end thereof (hereinafter referred to as the "leading end link assembly 11a") and the "trailing end link assembly 11b" for convenience sake), and the arm posture keeping mechanism (arm shape keeping mechanism) 14 for keeping the arm shape or posture of the leading end link assembly 11a from among these assemblies.

Figure 5:
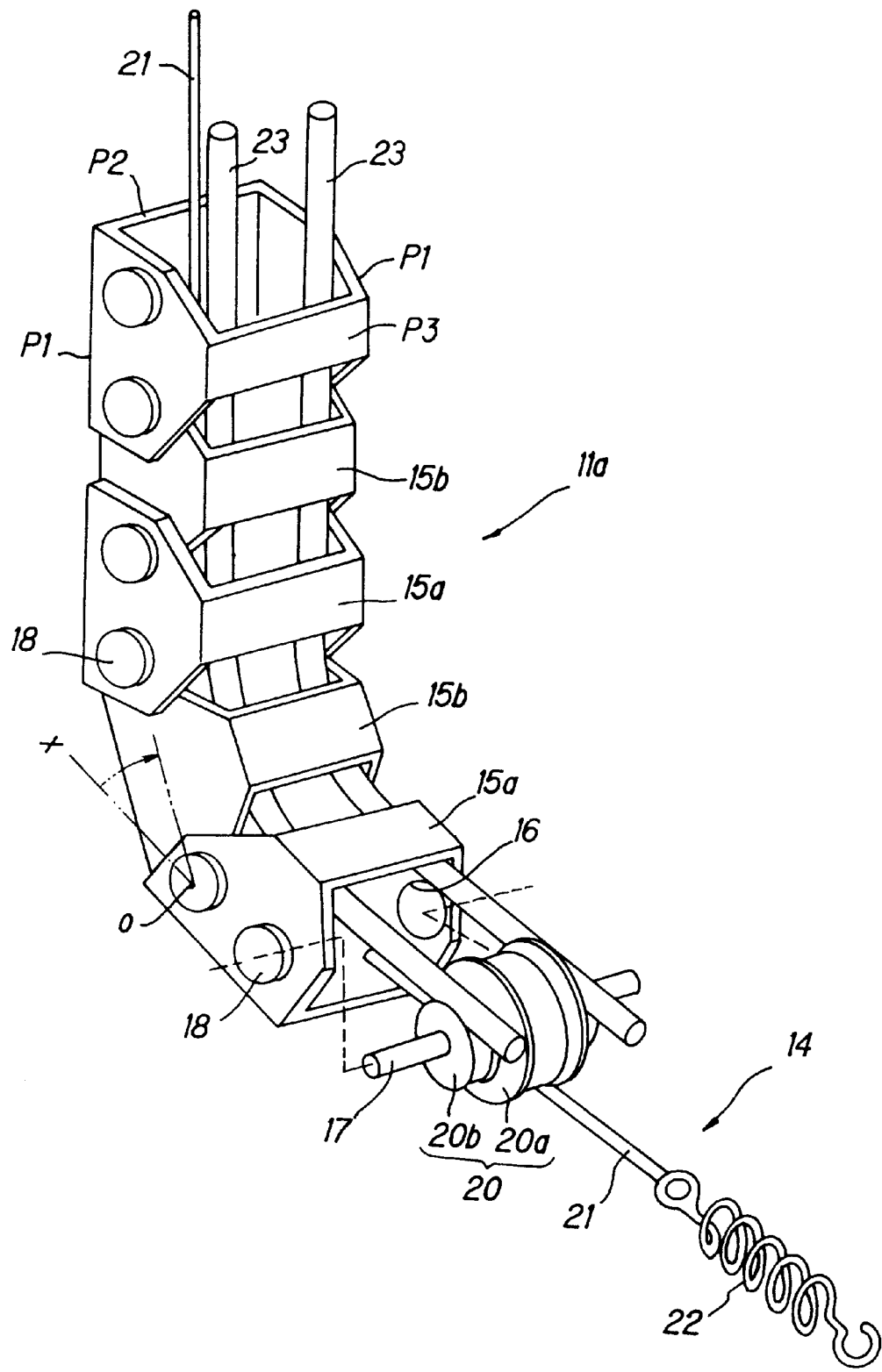
FIG. 5 is a schematic perspective view illustrating a partial construction of the arm link section.

As shown in FIG. 5, the leading end link assembly 11a is provided with two short links 15a and 15b having different sizes comprising frame members, and is formed by connecting a plurality of these short links alternately in an arm shape. Each of the short links 15a and 15b is formed by gathering, for example, a plurality of sheet members, i.e., two substantially trapezoidal side plates P1, a bottom side plate P2 and a front side plate P3 integrally or into a separate frame construction (frame member) (FIG. 5 shows an example of integral forming). Connecting holes 16 are pierced at prescribed positions in a direction at right angles to the arm axial direction on the two side plates P1 and P1.

The leading end link assembly 11a alternately connects the short links 15a and 15b inserting the pins 17 through the connecting holes 16 of the two side plates P1 and P1, and rotatably attaching link rollers 18 and 18 to the both ends of these pins 17. The leading end link assembly 11a is therefore flexural at an angle limited only in a direction to a reference direction x at which the bottom side plates P2 and P2 mutually form substantially 180° forming almost a straight line toward the respective front side plates P3 around the connecting fulcrum O, when viewing in a traveling direction limited by the shape and the position of the connecting fulcrum O of, for example, the two short links 15a and 15b, for each link.

As shown in FIG. 2, the trailing end assembly 11b is provided with a plurality (two in FIG. 2) of long links 19 and 19 connected to the output shaft of the arm driving mechanism 13, and formed into an arm shape by connecting these long links 19 and 19 through pins 17 and link rollers 18 as described above.

As shown in FIG. 5, the arm posture keeping mechanism 14 is provided with a link pulley 20 rotatably attached to a prescribed pin 17 (for example, at the leading and trailing ends) in the leading end link assembly 11a and link wire 21 guided by a pulley 20a at the center of the link pulley 20 and inserted through the bottom side plate P2 side (the side on which flexure of the leading end link assembly 11a is limited), and is secured in the trailing end link assembly 11b through a spring 22 in a state in which the link wire 21 is guided by the link pulley 20.

The link roller 20 has, in addition to the pulley 20a at the center thereof, pulleys 20b and 20b having a diameter smaller than that of the pulley 20a, at both end sides with the center portion in between, and these pulleys 20b and 20b guide, within the arm link section 11, cables 23 and 23 connecting the measuring element 1a and a separate apparatus such as an electrostatic capacity measuring instrument (not shown).

Figure 6:
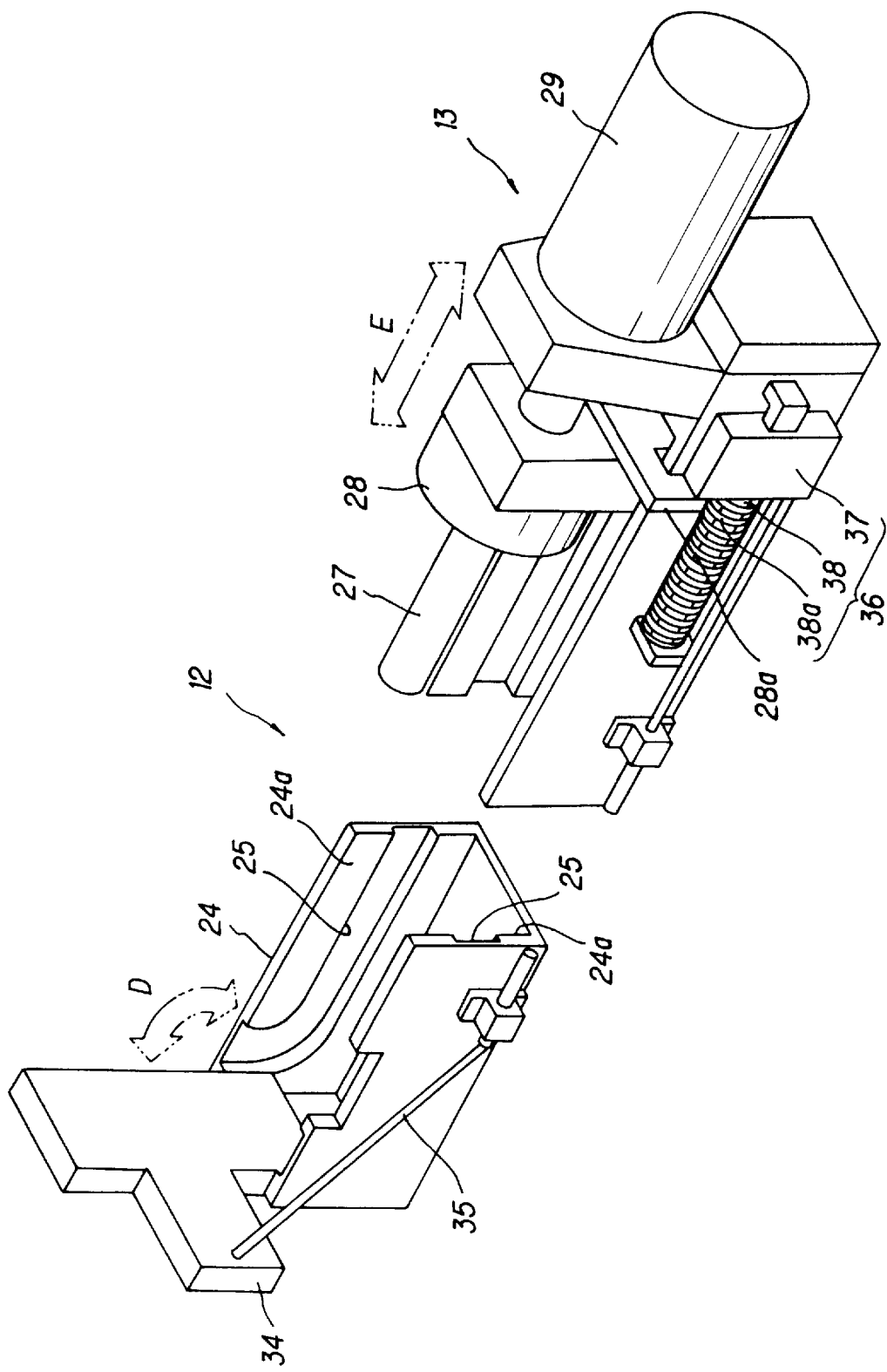
FIG. 6 is a schematic perspective view illustrating a partial construction of the arm housing section.

As shown in FIG. 6, the arm housing section 12 has an enclosure 24 extending in the axial direction, capable of housing the arm link section 11 and guides the arm link section 11 along guide rails 25 and 25 which is slotted on the both opposite side surfaces 24a and 24a of the enclosure 24. The guide rail 25 has a width equal to or larger than the diameter of the link rollers 18 of the leading end link assembly 11a and the trailing end link assembly 11b. The traveling direction thereof extends in the axial direction of the enclosure 24, and is formed so as to flex at a prescribed radius of curvature in a direction at right angles to the axial direction on the leading end side thereof. An opening (not shown) is provided at the end of the flexing portion of the guide rail, i.e., on the leading end side of the enclosure 24, so as to make the leading end arm unit 11a formed by attaching the measuring element 1a projectable to outside the enclosure 24 through this opening.

As shown in FIG. 6, the arm driving mechanism 13 comprises a feed screw 27 for driving the arm arranged in parallel with the traveling direction of the guide rail 25, a feed screw nut for arm driving slidably connected to this feed screw 27, and an arm motor 29 driving the feed screw 27 such as a servo motor connected to the trailing end of the feed screw 27. The feed screw 27 is rotatably attached to a bearing section outside the enclosure 24, and the feed screw nut 28 is connected to the long link 19 at the rear end of the trailing end link assembly 11b. The arm driving mechanism 13 causes the arm link section 11 to travel along the guide rail 25 (in the direction E in FIG. 6) by causing the feed screw nut 28 to slide in the axial direction while rotating the feed screw 27 through driving of the arm motor 29.

As shown in FIG. 2, a spare arm traveling apparatus 30 is provided in this arm driving mechanism 13. This spare traveling apparatus 30 comprises a spare arm motor 32 such as a servo motor connected to the feed screw 27 through an interlock 31, and a coupling section 33 connecting the feed screw 27 and the arm motor 29 with a shaft coupling. The spare arm motor 32 rotates only passively during service of the arm motor 29, not participating in the drive of the arm link section 11. When the arm motor 29 is not serviceable by a failure or the like, it actively drives to operate the feed screw 27 through the interlock 31. The coupling section 33 is exposed to permit manual adjustment. When the both motors 29 and 30 are in failure, the arm link section 11 is made manually movable by directly making manual adjustment. The arm driving mechanism 13 is provided with a vertical guide door 34 capable of opening/closing on the leading end side of the enclosure 24, and a sliding mechanism 36 connected to this vertical guide door 34 through a door operating wire 35. When the leading end arm unit 11b projects from inside the arm housing section 12, the vertical guide door 34 is opened to an angle on the extension of the flexing portion of the guide rail 25, and when the leading end arm unit 11b is housed, it is closed under the action of the force from the sliding mechanism 36 through the door operating wire 35 (in direction D in FIG. 6).

The sliding mechanism 36 comprises a rod-like rail 38 formed on an outside surface of the enclosure 24 in parallel with the axial direction of the feed screw 27 for a prescribed distance and formed by fitting a locking spring 38a for the door operating wire 35 in the axial direction thereof and a wire slide (body) 37 slidable along this rail 38, and forms this wire slide 37 into a body capable of coming into contact with the trailing end of a dog 28a of the feed screw nut 28.

The sliding mechanism 36 causes the wire slide 37 to slide for a prescribed distance toward the leading end side under the action of tensile force acting toward the leading end side of the door operating wire 35 along with the opening action of the vertical guide door 34 upon projection of the leading end arm unit 11b. During this sliding, the reaction force of the locking spring 38a received by the wire slide 37 pulls the door operating wire 35 without loosening toward the trailing end side. Upon housing the leading end arm unit 11b, the sliding mechanism 36 feeds the wire slide 37 by sliding to the trailing end side together with the feed screw nut 28 in a state caught by the dog 28a of the screw nut 28, and closes the door by pulling the door operating wire 35 toward the trailing end side.

Now, operation of the above-mentioned arm unit 10 will be described below with reference to FIGS. 7A to 7C.

Figure 7A:
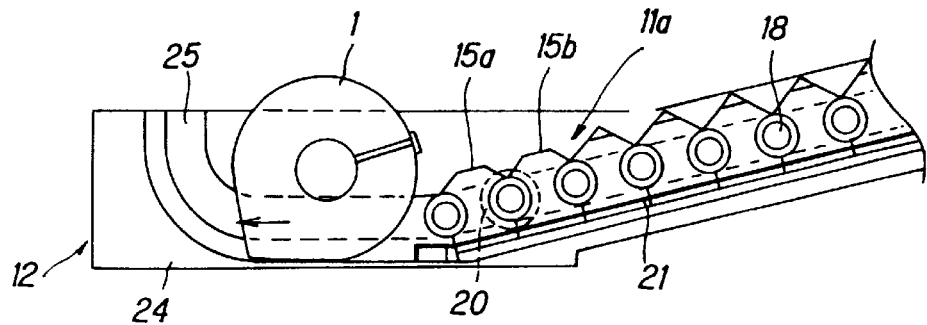
FIGS. 7A–7C are schematic sectional views illustrating operation of the arm unit.

As shown in FIG. 7A, the arm link section 11 attached with the probe 1 is housed in the arm housing section 12. Assume that the arm driving mechanism 13 is started in this state. Upon starting, the arm motor 29 operates, and the power thereof causes the feed screw 27 to rotate to cause parallel travel of the feed screw nut 28 toward the leading end side, whereby the rearmost long link 19 of the trailing end arm unit 11b connected to the feed screw nut 28 is moved toward the leading end side. At this point, the direction of travel of the link roller 18 is constrained by the guide rail 25. The leading end arm unit 11a is thus caused to travel in parallel toward the leading end side in the traveling direction of the guide rail 25 together with the probe 1.

Figure 7B:
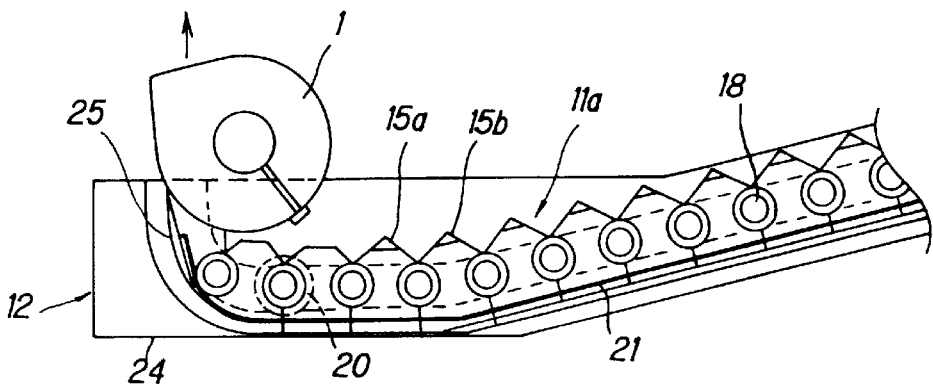

Then, as shown in FIG. 7B, when the leading end arm unit 11 reaches the flexing portion of the guide rail 25, the top short link 15 and subsequent ones are sequentially guided from horizontal to vertical directions.

Figure 7C:
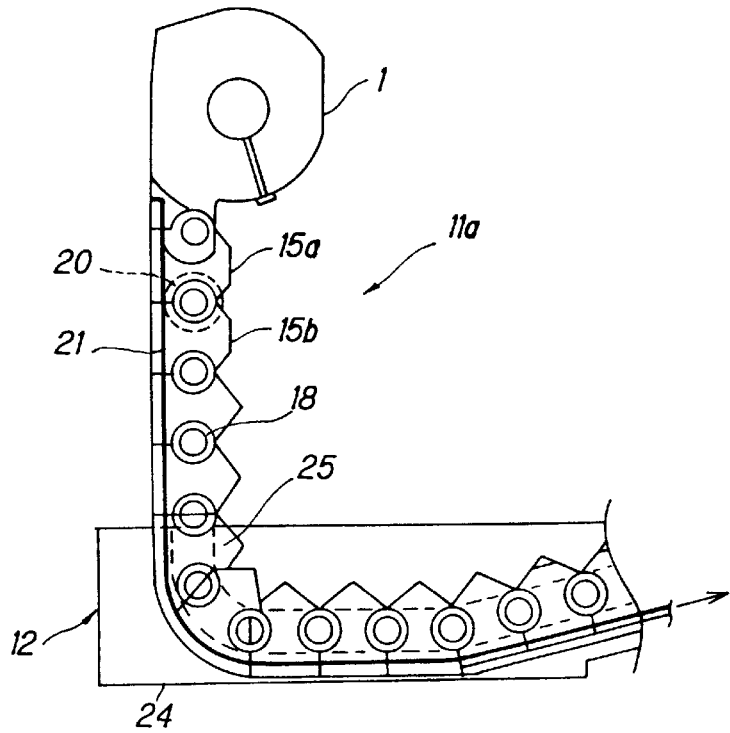

Then, as shown in FIG. 7C, the leading end arm units 11a project in the direction of extension of the guide rail 25, i.e., to outside the enclosure 24, while changing the direction to vertical, sequentially from the short link 15 at the top. At this point, the path distance of the leading end arm unit 11a increases by the distance of curved portion resulting from the radius of curvature of the guide rail 25. The spring 22 of the arm posture keeping mechanism 14 therefore extends, and the reaction force of the spring 22 pulls the link wire 21 toward the trailing end side. As a result of this pulling force of the link wire 21, the short links 15a and 15b in the projecting state receive the force on the side on which flexure is limited (bottom plate side), and the posture of the leading end arm unit 11a after projection is maintained so that the arm shape is kept straight.

Now, an outline of the moving apparatus 40 will be described below with reference to FIGS. 8 to 10, in addition to FIGS. 1 and 2.

As shown in FIG. 1, the moving apparatus 40 is provided with a support 41 adjustably attached to the periphery (cylinder face) of the rotor unit 130, and a moving member 42 which travels around the rotor unit 130 relative to the support 41. The foregoing arm unit 10 is attached as a separate unit to the moving member 42.

Figure 8:
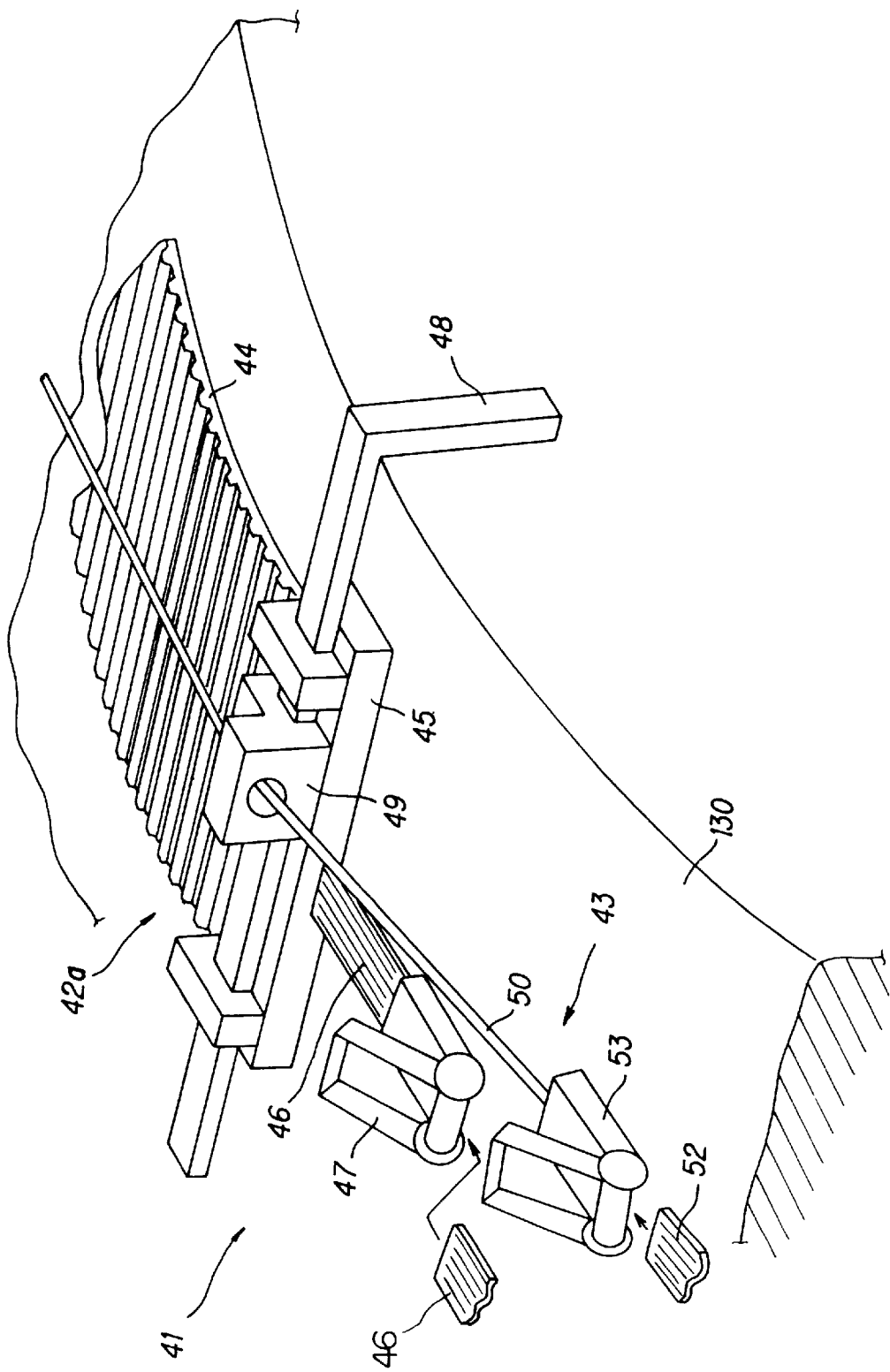
FIG. 8 is a schematic sectional view illustrating a partial construction of a track belt section and a pressing wire section.

The support 41 has, as shown in FIG. 8, a track belt section 42a which determines a traveling locus of the moving member 42, and a pressing wire 43 which presses and support appropriately the moving member 42 against the track belt section 42a.

The track belt section 42a has a wide toothed belt 44. The toothed belt 44 is installed around the rotor unit 130 by providing track belt end fixing sections (hereinafter simply referred to as the "fixing sections") 45 and 45 at the both ends, respectively, of the toothed belt 44, attaching hoisting belts 46 and 46 for fixing the track belt to the fixing sections 45 and 45, securing a ratchet 47 to one of the hoisting belts 46 and 46, and hoisting up the other of the hoisting belts 46 and 46 with this ratchet 47. Installing position adjusting scales 48 and 48 are attached to the fixing sections 45 and 45.

The pressing wire section 43 is provided with a pressing wire 50 to be inserted into wire guides (holes) 49 and 49 provided in the fixing sections 45 and 45, and a tension regulator (tension controller) 51 to be inserted in the middle of the pressing wire 50. The pressing wire 50 is arranged around the track belt section 42a through the wire guides 49 and 49 by providing a hoisting belt 52 for securing the pressing wire onto one of the both ends of the pressing wire 50, providing a ratchet 53 on the other, and releasably connecting the hoisting belt 52 to the ratchet 53.

Figure 9:
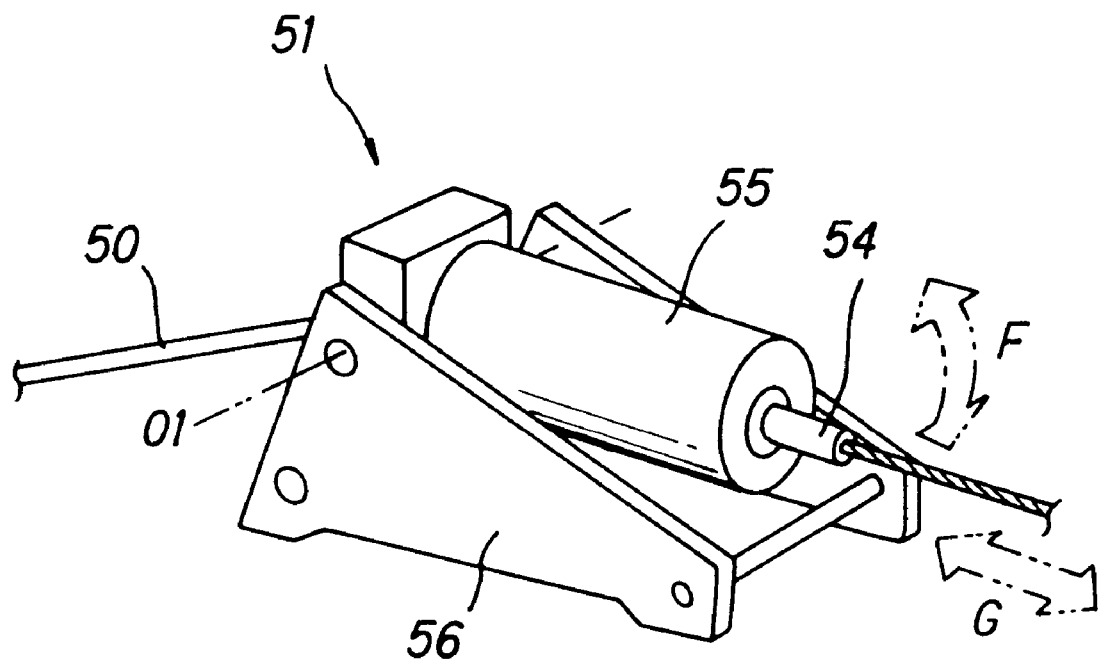
FIG. 9 is a schematic plan view illustrating a partial construction of a cylinder face circumferential moving apparatus.

The tension regulator 51 is provided, as shown in FIG. 9, with a cylinder 55 having a piston 54, and a frame 56 tiltably (head-movably) supporting the cylinder 55 around a rotation fulcrum 01, and secures the hoisting belt 52 on the bottom side of the cylinder 55 and on the leading end side of the piston 54, adjusts the horizontal travel of the pressing wire 50 by the operation in the stroke direction (see direction G in FIG. 9) caused by a compression spring (not shown) of the piston 54 relative to the cylinder 55, and adjusts the vertical travel of the pressing wire 50 through tilting motion (see direction F in FIG. 8) of the cylinder 55 relative to the frame 56.

Figure 10:
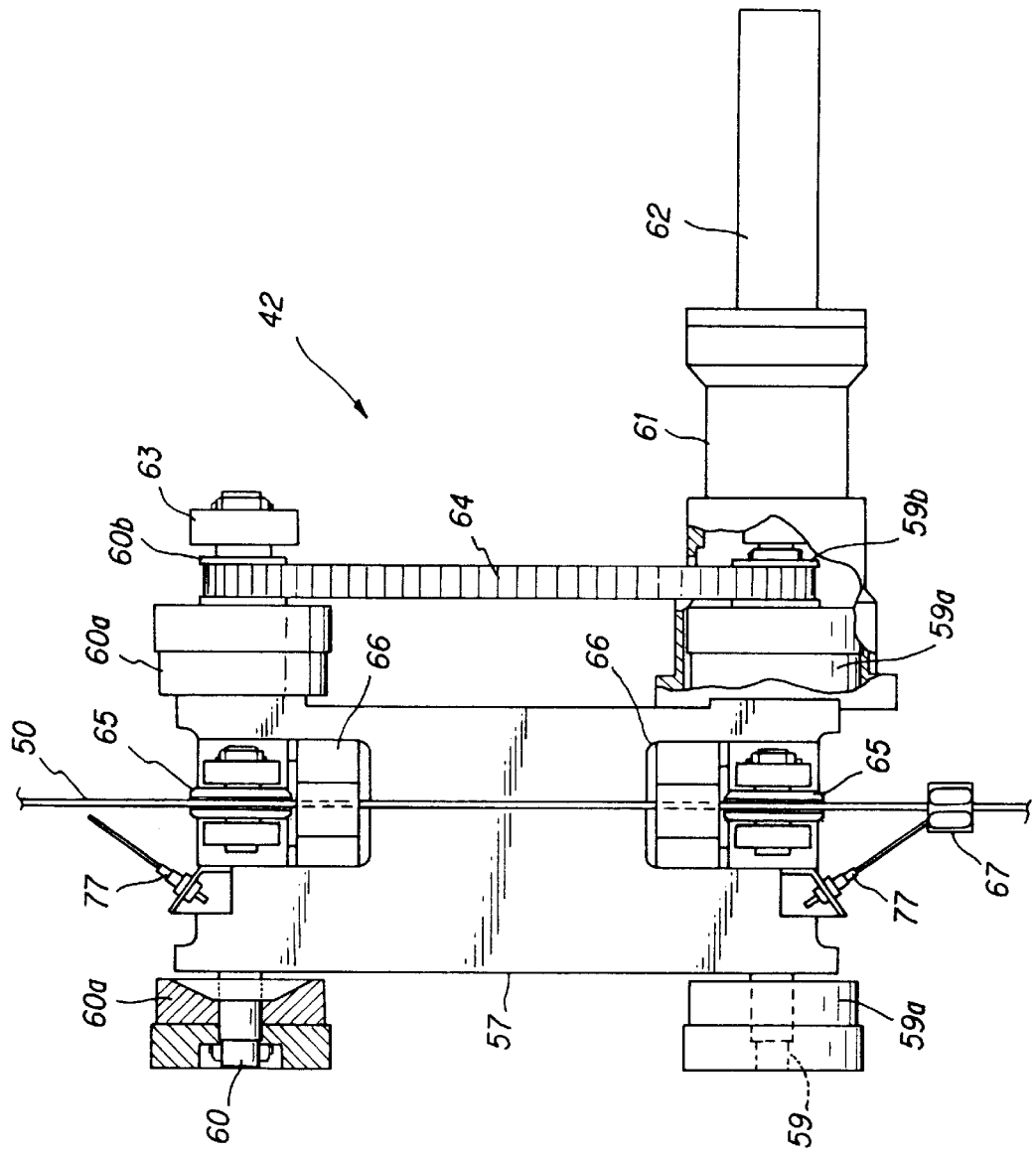
FIG. 10 is a schematic perspective view illustrating a whole construction of a tension regulator.

As shown in FIGS. 1 and 10, the moving member 42 has, for example, a rectangular body 57. Wheel shafts 59 and 60 are provided at two front and rear positions of the body 57, and tire pulleys 59a and 60a engaging with teeth of the toothed belt 44 are provided on the both end sides of the wheel shafts 59 and 60. A transmission pulley 59b and a circumferential motor 62 such as a servo motor via a reducer 61 are connected to the outside of the tire pulley 59a, and a phase regulator 63 is connected to the outside of the other tire pulley 60a through a transmission pulley 60b. These transmission pulleys 60b and 59b are mutually connected with a transmission belt 64. Wire pulleys 65 and 65 for passage of the pressing wire 50 and wire guides 66 and 66 are pressed against the top of this moving member 42 at two positions, and a wire guide 67 is provided on the pressing wire 50 at an appropriate position (reference numeral 77 in FIG. 10 represents a contact sensor).

Now, an installation procedure and operations of the above-mentioned moving apparatus 40 will be described below.

First, upon installing the moving apparatus 40, the toothed belt 44 is mounted on a cylinder face of the rotor unit 130 (protecting ring 122). Then, while aligning the ends of the installing position adjusting scales 48 and 48 with the end face in the axial direction of the rotor unit 130, the toothed belt 44 is arranged horizontally to this end face. In this state, the hoisting belt 46 is caused to rotate around the rotor unit 130 by a turn. This is hoisted in a ring shape with the ratchet and the toothed belt 44 is secured around the rotor unit 130.

Upon completion of installation of the toothed belt 44, the moving member 42 is arranged on the belt 44. At this point, the pressing wire 50 is caused to pass through the wire pulleys 65 and 65, and the wire guides 66 and 66 are locked so as to prevent the pressing wire 50 from coming off. In this state, the hoisting belt 52 for securing the pressing wire is wound around the rotor unit 130 by a turn, and this is hoisted with the ratchet 53 into a ring shape. Upon hoisting, the ratchet 53 is operated while confirming the amount of change in stroke of the piston 54 of the tension regulator 51, to adjust tension of the pressing wire 50. The moving apparatus 40 is movably mounted on the rotor unit 130 of the moving member 42, thus completing the installation of the moving apparatus 40.

Then, upon starting this moving apparatus 40, the motor 62 for the circumferential direction operates, and the driving force thereof is reduced and transmitted from a transmission pulley 59b through a transmission belt 64 to the other transmission pulley 60b. The four tire pulleys 59a and 60a rotate, and the moving member 42 travels on the toothed belt 44. During this travel, mutual engagement phase of the tire pulleys 59a and 60a with the toothed belt 44 is appropriately adjusted by means of a phase regulator 63.

Even when there occurs a change in the length of the pressing wire 50 at the end of the toothed belt 44 during travel of the moving member 42, tension is appropriately adjusted by means of the amount of contraction of the compression spring of the tension regulator 51. Further, even when there occurs a change in the height of the pressing wire 50 depending upon the position of travel of the moving member 42, it is appropriately adjusted by tilting of the cylinder 55 so that the stroke direction of the piston 54 and the axial direction of the wire 50 are always located on the same straight line, thus avoiding the undesirable force or moment in the transverse direction produced in the compression spring or the piston 54.

Now, an outline of the moving position control system 70 will be described below with reference to FIG. 2.

The moving position control system 70 is provided with an axial positioning regulator 71 which causes the arm unit 10 to move by a prescribed distance in the axial direction of the rotor unit 120 relative to the moving apparatus 40 installed on the rotor unit 130.

The axial positioning regulator 71 has a linear guide 72 for guiding the arm unit arranged in the axial direction of the rotor unit 130 in the upper portion of the moving member 42, and causes the arm housing section 12 to travel along the linear guide 72. For example, a motor 73 for the arm housing section such as a servo motor similar to the above-mentioned arm moving mechanism 13, a feed screw 74 for moving the arm housing section, and a feed screw nut 75 are attached to the bottom side of the enclosure 24. In parallel with these components, the feed screw nut 75 is secured to the arm unit 10, and the leading end side of the feed screw 74 is rotatably attached to a bearing section not shown of the moving member 42.

A camera 75a and a distance sensor 76 are attached to the leading end side of the arm housing section 12 for the moving position control system 70.

Now, operations of this embodiment as a whole will be described below with reference to FIG. 2.

First, an outline of the stator winding to be measured in this inspection apparatus will be described. As shown in FIG. 2, the distance between the rotor unit 130 and the stator unit 120 is, for example, as small as 60 mm. The stator windings 103a and 103b on the outside diameter side and on the inside diameter side of the stator unit 120 are arranged in a direction formed by an involute curve curving in mutually opposite directions and so as to form a mesh-like crossings. Particularly, the stator winding 103a on the outside diameter side is arranged at a position, for example, about 300 mm apart from the surface of the protecting ring 122 of the rotor unit 130. The measuring element 1a should be pressed from such a gap between the stator windings 130.

In the inspection apparatus of this embodiment, therefore, the measuring element 1a is guided to the measuring position P of the stator winding 103 while avoiding the above mesh portion. There is therefore tried an operation in which it moves in the axial direction through a narrow gap of about 60 mm and then rises up vertically by about 300 mm (see FIG. 2).

The moving apparatus 40 is first installed on the rotor unit 130 (protecting ring 122) in the foregoing steps, and It is caused to travel along the circumferential direction (see direction C in FIG. 1) of the rotor unit 130 into the gap between the stator winding 103 and the rotor unit 130 specified as the first measuring position P.

Then, the motor 73 for the arm housing section operates by starting up the axial positioning regulator 71, and the driving force thereof is transmitted to the feed screw 74. The feed screw nut 75 travels in parallel, and the arm unit 10 is caused to slide in the axial direction (see direction A in the drawing) of the rotor unit 130 relative to the moving apparatus 40. The axial position of the probe 1 is thus adjusted to the inserting position in the radial direction looking out the measuring position P between the stator windings 103.

Then, as the arm unit 10 executes the above-mentioned arm operations, the leading end arm unit 11a rises up at an angle (see B in the drawing) toward the measuring position P side of the stator winding 103a while maintaining the linear arm posture, and while keeping the linear arm posture, the probe 1 is inserted into a slot in the stator winding 103, together with the leading end arm unit 11a.

Then, after the probe 1 reaches the measuring position P of the stator winding 103, the measuring element 1a is pressed against the stator winding 103 by expanding the bellows 3a and 3b, and in this state, electrostatic capacity is measured. Upon completion of this measurement, the bellows 3a and 3b are caused to contract, and the measuring element 1a is housed in the base 2. The leading end arm unit 11a is housed in the arm housing section 12 through the reverse sequence of steps to the above. After confirming the state of the housed probe 1 with a camera 75a or the like, the moving apparatus 40 is caused to travel in the circumferential direction of the rotor unit 130 toward the measuring position P specified for the next stator winding 103. Subsequently, these steps are repeated until completion of measurement of all the stator windings 103.

According to this embodiment, therefore, it is possible to relatively easily and accurately inspect the stator winding in the arrangement as it is without withdrawing the rotor unit from the stator unit as has been necessary in the conventional method, and complete the inspection operations within a short period of time.

Now, unique advantages, including respective secondary effects, of the probe, the arm unit and the moving apparatus, will be described, in addition to the above-mentioned ones.

First, as to the probe, since the measuring element is housed in the base, it is possible to prevent trouble in which the measuring element is caught by a projection in the electric rotating machine, and there is available another advantage of easily guiding the measuring element into the gap subjected to a size restriction within the electric rotating machine. Because the measuring element is formed into a circular shape, it is possible to further reduce measuring errors caused by the difference in the pressing direction against the stator winding and downsize the apparatus.

The measuring element is pressed against the stator winding by the utilization of the bellows. It is therefore possible to approximately adjust the pressing force through pressure manipulation of the pneumatic source. Because the air path communicates with the right and left bellows, it is possible to press the right and left bellows against the stator winding under equal force irrespective of the center position of the probe. As a result, even when the inserting position of the arm shows a slight shear, the pressing force can be kept constant.

The reaction force to pressing is received, not by the arm link section which is a support thereof, but by the stator winding (coil) on the opposite side. Almost any undesirable force or moment in the transverse direction produced in the arm link section can therefore be prevented.

Since the outer plate of the bellows follows the external shape, it is possible to uniformly press the measuring element even for the curved portion of the stator winding.

Then, as to the arm unit, the arm operation comprising passing through the gap (a narrow space) between the rotor unit and the stator- unit in the electric rotating machine, and after a horizontal travel, reaching a specified position while maintaining a linear posture by rising up substantially vertically can be accomplished by a simple arm driving of a degree of freedom 1. By changing the pressing position of the arm, the rise-up position of the arm leading end can be appropriately adjusted.

As the spare arm unit is mounted, it is possible to drive the arm link section as it is even the arm motor becomes unserviceable. Particularly, even when all the drive sources inducing the spare motor stop by failure upon inserting the leading end arm unit of the arm link section into the slot, it is possible to house the arm link section in the arm housing section by manual operation without removing the rotor unit from the stator unit, thus permitting further improvement of reliability of the apparatus.

Because the vertical guide door is mounted, it is possible to complete the extension of the curved portion of the groove for guide rail, as well as to set a further lower height of the arm housing section, thus permitting further acceleration of downsizing of the arm unit.

As the link is formed into a frame shape, cables and the like for connecting the devices such as the measuring element and the apparatus body can be housed only within links in the arm link section without the need to conduct complicated transfer.

The cylinder face circumferential moving apparatus provides advantages that it is possible to easily install a locus for determining the circumferential direction of the rotor unit within a narrow operating space and easily install the moving apparatus only by stretching the wire while appropriately maintaining tension of the pressing wire. As a result, travel in an arbitrary posture is possible around the rotor unit. In addition, even for a rotor unit having a different diameter resulting from a difference in model of the electric rotating machine, the simple apparatus configuration is applicable as it is without depending upon addition of a new mechanism or a change in the radius of curvature of the moving member.

As engagement between the tire pulley and the toothed belt is utilized, it is possible to avoid almost any such trouble as slipping, shifting or tilting of the inspection apparatus on the rotor unit, thus permitting maintenance of circumferential positioning accuracy of the rotor unit. The wide width of the toothed belt can mainte with a high accuracy of axial posture of the rotor unit.

Even with a change in the pressing wire length, fluctuation of tension can be reduced. An excessive or insufficient tension can be avoided. The inspection apparatus can stably travel in the circumferential direction on the cylindrical surface of the rotor unit.

Now, examples of appllication Nos. 1 to 5 of this embodiment will sequentially be described below.

1) A first example of application has a construction In which a fitting installable on the rotor unit 130 is provided in place of the moving apparatus 40, and the fitting is formed, for example, with a hoisting belt arranged in the middle of the ratchet.

In this example of application, the arm unit 10 is mounted on the upper portion of the protecting ring 122 of the rotor unit 130, and after winding the hoisting belt around the rotor unit 130, the belt is hoisted by means of the ratchet and the arm unit 10 is secured to the protecting ring 122. The rotor unit 130 is rotated by controlling the rotation angle of the rotor rotating motor provided in the electric rotating machine, thereby positioning the arm unit 10 at a prescribed slot position.

According to this example of application, therefore, it is possible to measure electrostatic capacity of the stator winding by guiding the probe to the specified measuring position without pulling out the rotor unit from the electric rotating machine as in the case mentioned above. Particularly, omission of the moving apparatus in this example permits achievement of a further simpler apparatus as a whole.

2) A second example of application is based on a construction in which the camera 75*a* and the distance sensor 76 of the travel position control system 70 are used at strategic portions, and the origin position of the Inspection apparatus of the above embodiment is set in controllers of the foregoing motors 62 and 73.

For example, the position of the origin in the circumferential direction (see direction C in FIG. 1) of the rotor unit 130 is stored as such in the controller of the circumferential motor 62 by manually causing the inspection apparatus to the position to become the origin while the measuring operator confirms the same through the camera 75*a* after installing the inspection apparatus on the rotor unit 130.

The position of the origin in the axial direction (see direction A in FIG. 1) of the rotor unit 130 is stored as such in the controller of the arm housing motor 73 by manually adjusting the axial position of the arm unit 10 by means of the axial position regulater 71 while measuring the relative distance between the rotor unit 130 and the stator unit 120 by means of the distance sensor.

According to this example of application, therefore, it is possible to set an origin at an arbitrary position in the circumferential and axial directions of the rotor unit. This provides an advantage of permitting ensuring a relative positional accuracy relative to the stator unit, even when there occurs a positional shift of the toothed belt, or a shear of the axial position of the rotor unit relative to the stator unit.

3) The third example of application is based on a construction in which controllers are provided for the above-mentioned individual motors (servo motors) 29, 32, 62 and 71 and these controllers are previously set to control the state of excitation of the motor windings on the basis of measuring times of the stator winding. More specifically, in this example, after positioning of the probe 1 by operation of the motor, the motor winding becomes in a non-excited state under the effect of a control signal from the controller, and in this state, the stator winding 103 is measured. After measurement, a control signal from the controller brings the motor winding into an excited state, and then operates the motor.

According to this example of application, there is particularly provided an advantage of further reducing the effect of noise signal in the measurement of electrostatic capacity caused by the driving source of the inspection apparatus.

4) The fourth example of application is based on a construction in which there is provided a relay circuit ON/OFF-switching over the connection of the motor controller and the motor, in addition to the construction of the above-mentioned third example of application. More specifically, in this example of application, after controlling the motor winding to a non-excited state in the same steps as above, the connection between the controller and the motor is temporarily switched off by the operation of the relay circuit, leading to a non-detection state of the rotation angle of the motor in the controller (detecting circuit), and the stator winding is measured in this state. After measurement, the relay circuit brings the connection between the controller and the motor back to the ON state, and the motor winding is controlled by the same steps as above into an excited state, this subsequently causing the motor to operate.

According to this example application, therefore, it is possible to inhibit occurrence of electric noise from the motor section, and further, to inhibit occurrence of electric noise of signals from the detecting circuit of the rotation angle of the motor. There is therefore provided an advantage of further reducing the effect of the occurrence of noise sources on the measured value of electrostatic capacity and further improving the measuring accuracy.

5) The fifth example of application comprises an instructed operation pendant (portable unit) and a circumferential travel limiter, in addition to the arm unit 10 and the moving apparatus 40.

In this example of application, the circumferential travel limiter limits (controls) use/non-use of the circumferential motor 62 on the basis of the housed state of the probe 1 in the arm unit 10, when the operator manually moves the inspection apparatus, by switching over the mode to the manual mode previously set in the instructed operation pendant. More specifically, when the probe 1 is not housed, the instructed operation pendant prohibits driving of the circumferential motor 62, and permits driving of the motor 62 only during housing of the probe 1.

According to this example of application, therefore, there is particularly provided an advantage of avoiding the inconvenience that the inspection apparatus may travel in the circumferential direction of the rotor unit with the arm link section thereof as inserted in the slot as a result of a malfunction, and collide with the electric rotating machine.

While the link wire is adopted as the arm posture keeping mechanism in this embodiment, the present invention is not limited to this. For example, a leaf spring may be provided in place of the link wire. In this case, the restoring force (resistance) produced in a direction reverse to the flexing direction of the leaf spring can maintain the link posture at an angle on the flexure limiting side. As a result, as in the above case, it is possible to achieve an arm operation in which the arm link section rises up while maintaining a linear posture after projection of the leading end link assembly.

While the toothed belt and the toothed pulley are adopted for the moving apparatus in this embodiment, the present invention is not limited to this. For example, a roller chain may be used in place of the toothed belt, and sprockets may be used in place of the toothed pulley. In this case as well, the same effects as above are available.

While the present invention is applied to the inspection apparatus of the stator winding of the electric rotating machine in this embodiment, the present invention is not limited to this. For example, the above-mentioned probe, arm unit and moving apparatus as standalone apparatuses are well applicable, not only to power generator-related areas such as electric rotating machines, but also widely in such various areas as inspection, test and research.

For example, the probe is applicable, not only for the measurement of electrostatic capacity, but also, so far as with a measuring element is attachable to the side of the bellows, to an inspection apparatus using the measuring element, such as an ultrasonic measuring instrument using an ultrasonic probe.

The arm operation in which the arm unit is, for example, horizontally inserted into a narrow gap, and then, for example, suddenly rises up vertically can be easily achieved in a simple configuration. It is therefore applicable particularly to an inspection apparatus using a measuring element, which carries out inspection to measure an arm structure of a high degree of freedom, a structure not allowing installation of a complicated driving mechanism, or a limited space such as a narrow gap between structures.

The moving apparatus is applicable, in addition to the rotor unit, to an inspection apparatus using a measuring element, which performs inspection while moving the apparatus in the circumferential direction on the guide surface of a cylindrical structure such as a pipe, on structures surrounding such a cylindrical structure.

SECOND EMBODIMENT

Now, a second embodiment of the present invention will be described below with reference to FIGS. 11 to 13. In this embodiment, the arm unit of the foregoing embodiment is partially modified. For substantially the same or corresponding components as those in the first embodiment, the same or equivalent reference numerals are used, and the description is simplified or omitted here.

Figure 11:
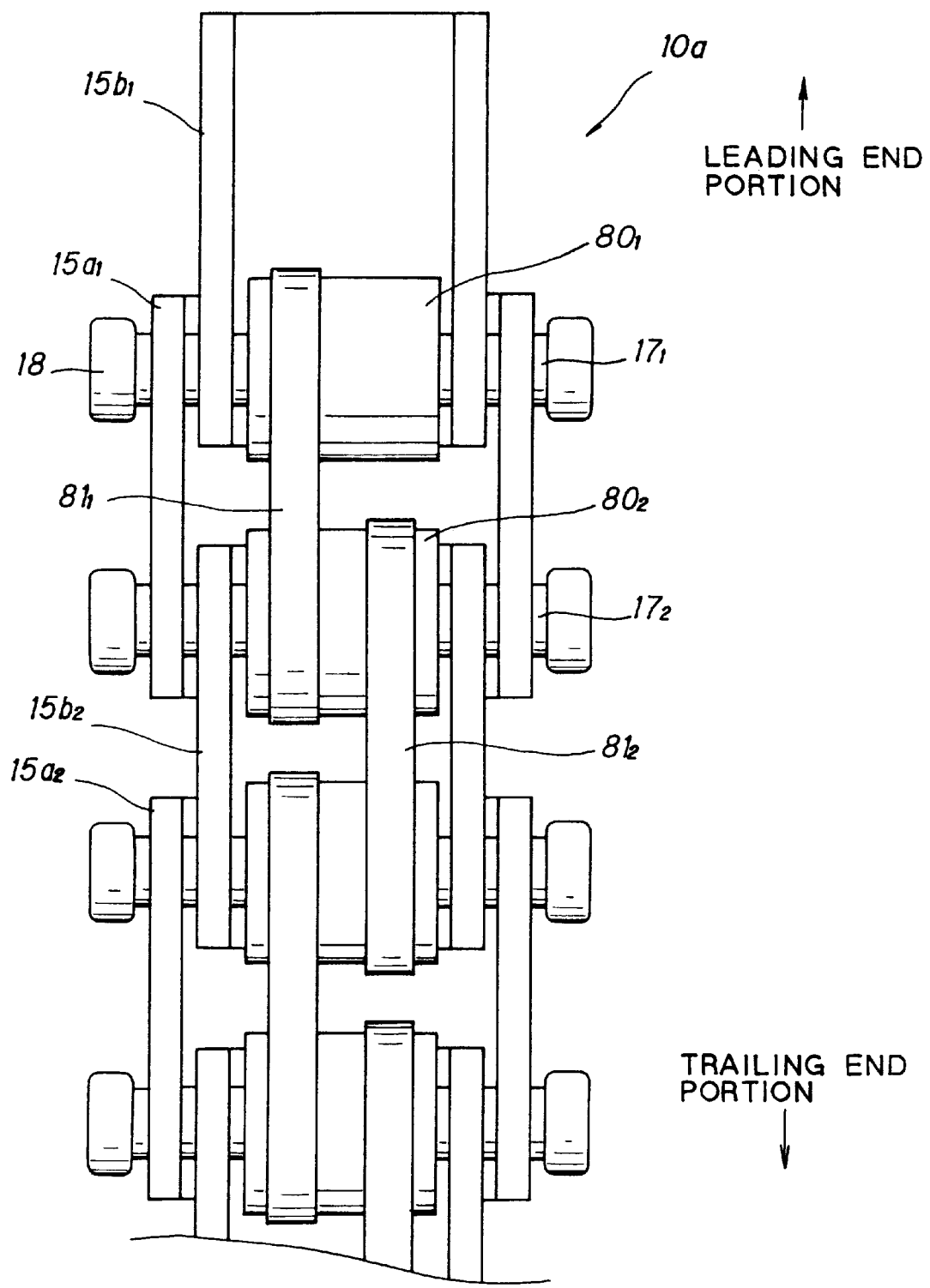
FIG. 11 is a schematic plan view illustrating a partial construction of an inspection apparatus of a second embodiment.

The arm unit 10a shown in FIG. 11 has a modified shape of the short link 15b inside the leading end link assembly 11a and a changed construction of the arm posture keeping mechanism 14. All the other components are substantially the same as in the above embodiment.

The short links 15bn (assigned reference numerals "n=1, 2, ..., x-1" sequentially from the leading end side) are formed, as viewed from the axial side surface of the pin 17n shown in FIG. 12, from frame members made by forming two side plates P1 and P1 into substantially a rectangular shape and curving the two short sides to follow the radius of curvature of the toothed pulley described later.

The arm posture keeping mechanism 14a comprises a plurality of toothed pulleys 80n rotatably attached in a plurality of outside and inside short links 15an and 15bn except for the rear end inner short link 15bx in the leading end link assembly 11a, in place of the above-mentioned link pulley 20, link wire 21 and spring 22, a toothed pulley 80a for constraining the angle (hereinafter referred to as the "angle constraining pulley") attached in the rearmost short link 15bx, and a plurality of toothed belts 81n connected sequentially by alternate belt catching between adjacent toothed pulleys 80(n+1) and 80n including this angle constraining pulley 80a. Among these pulleys, the outer periphery of the topmost toothed pulley $80_1$ has a projection 82.

The arm posture keeping mechanism 14a is provided further with stoppers 83na and 83nb at two positions before and after in the outer short link 15an, and a stopper 84 capable of coming into contact with the projection 82 of the toothed pulley $80_1$ in the topmost short link 15b1.

Now, the operating principle of this arm unit 10a will be described below with reference to FIG. 12.

As a result of connection of the toothed pulleys 80n having equal diameters by means of toothed belts 81n, rotation of all the toothed pulleys 80n is always kept in same direction, and the relative angle of adjacent toothed pulleys 80(n+1) and 80n is kept constant. Since the angle constraining pulley 80a is fixed to the rearmost short link 15bx, all the toothed pulleys 80n have a uniform angle relative to the rearmost short link 15bx. Further, since the rearmost short link 15bx travels only on the horizontal portion of the guide rail 25, the rotation angle of the angle constraining pulley 80a becomes constant relative to the arm unit 10a.

Figure 12:
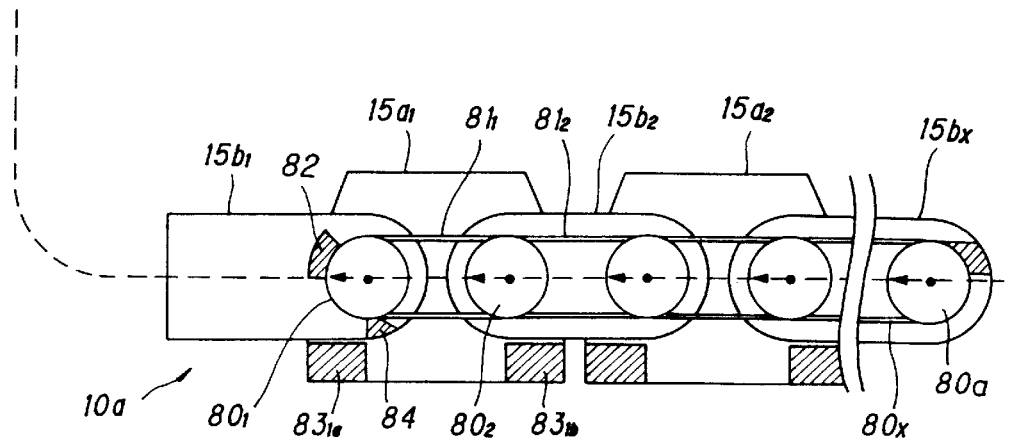
FIG. 12 is a schematic sectional view illustrating a partial construction of an arm link section.

Even when the arm link section 11 flexes, therefore, the angle of all the toothed pulleys 80a is constant relative to the guide rail 25 (for example, the triangle marks in FIG. 12 always maintains a direction).

Now, the rise-up operation of the arm link section 11 will be described below with reference to FIG. 13.

Figures 13A, 13B, 13C:
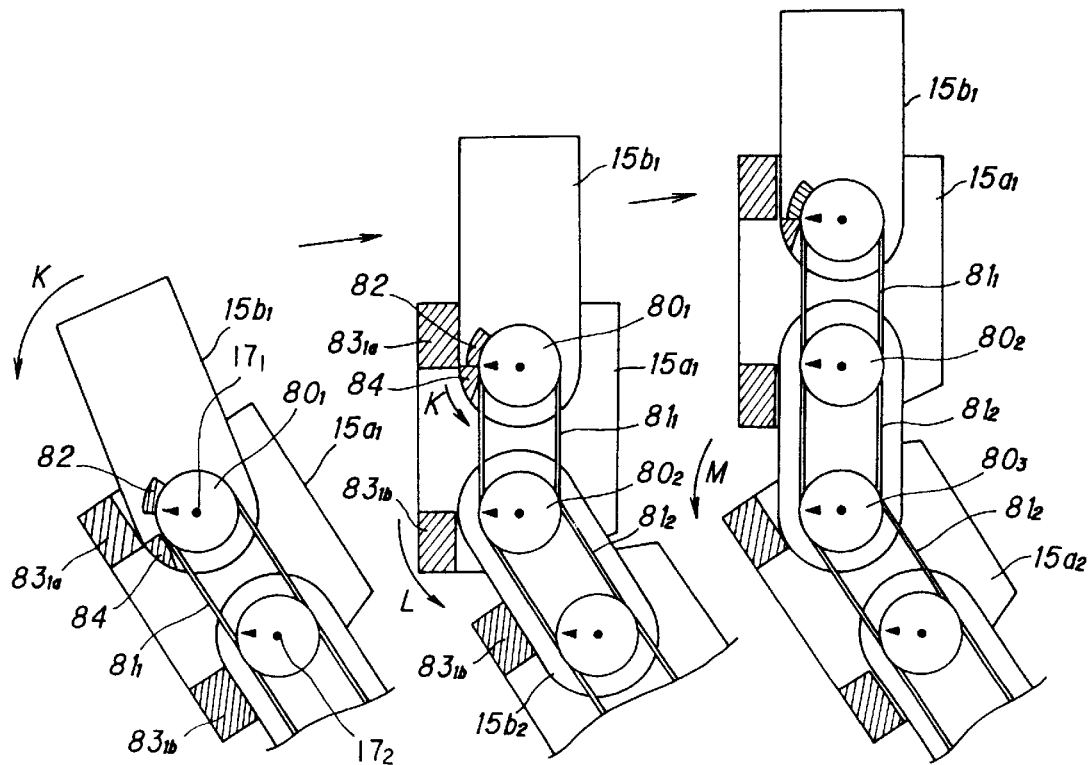
FIGS. 13A to 13C are schematic sectional views illustrating operations of the arm link section.

First, as shown in FIG. 13A, the arm link section 11 travels along the guide rail 25, and when the topmost short link 15b1 flexes, this short link 15b1 rotates relative to the first toothed pulley $80_1$. Then, when the projection 82 of the toothed pulley $80_1$ comes into contact with the stopper 84, the toothed belt $81_1$ causes the short link 15b1 to rotate around the axial direction of the pin $17_1$ in direction K in FIG. 13A.

Then, as shown in FIG. 13B, when the arm link section 11 is pushed out, the topmost short link 15b1 comes into contact with the stopper $83_1a$ in the adjacent short link 15a1, thus maintaining the linear posture of the both short links 15b1 and 15a1. Thus, the toothed belt $81_2$ causes the adjacent short links 15b1 and 15a1 to integrally rotate around the pin $17_2$ in direction L.

In the meantime, as shown in FIG. 13C, the topmost short link 15b1 continues to receive the K-direction moment in FIG. 13C under the effect of the toothed belt $81_1$, thus maintaining the contact state between this short link 15b1 and the stopper $83_1a$ and keeping the linear posture of the adjacent short links 15b1 and 15a1. Further, when the arm link section 11 is pushed out, the short link 15a1 comes into contact with the stopper 831b and forms a straight line shape with the short link 15b2.

As a result of sequential repetition of the above steps, the portions of the individual links 15an and 15bn projecting from the guide rail 25 independently rise up while maintaining the linear shape.

By adjusting the angle of the angle constraining pulley 80a, it is possible to adjust the allowable angle until contact of the projection 82 of the toothed pulley $80_1$ at the arm leading end with the stopper 84, and to adjust the inclination of the straight line formed by the arm link section 11.

According to this embodiment, therefore, particularly the link portion projecting from the guide rail can rise up while maintaining the linear posture, and this provides an advantage of adjusting the rise-up angle of the arm link section.

THIRD EMBODIMENT

Now, a third embodiment of the present invention will be described below with reference to FIG. 14. This embodiment is achieved by modifying the probe in the above embodiment. For substantially the same or corresponding components as in the above embodiment, the same or equivalent reference numerals are used, and the description is simplified or omitted here.

Figures 14A, 14B:
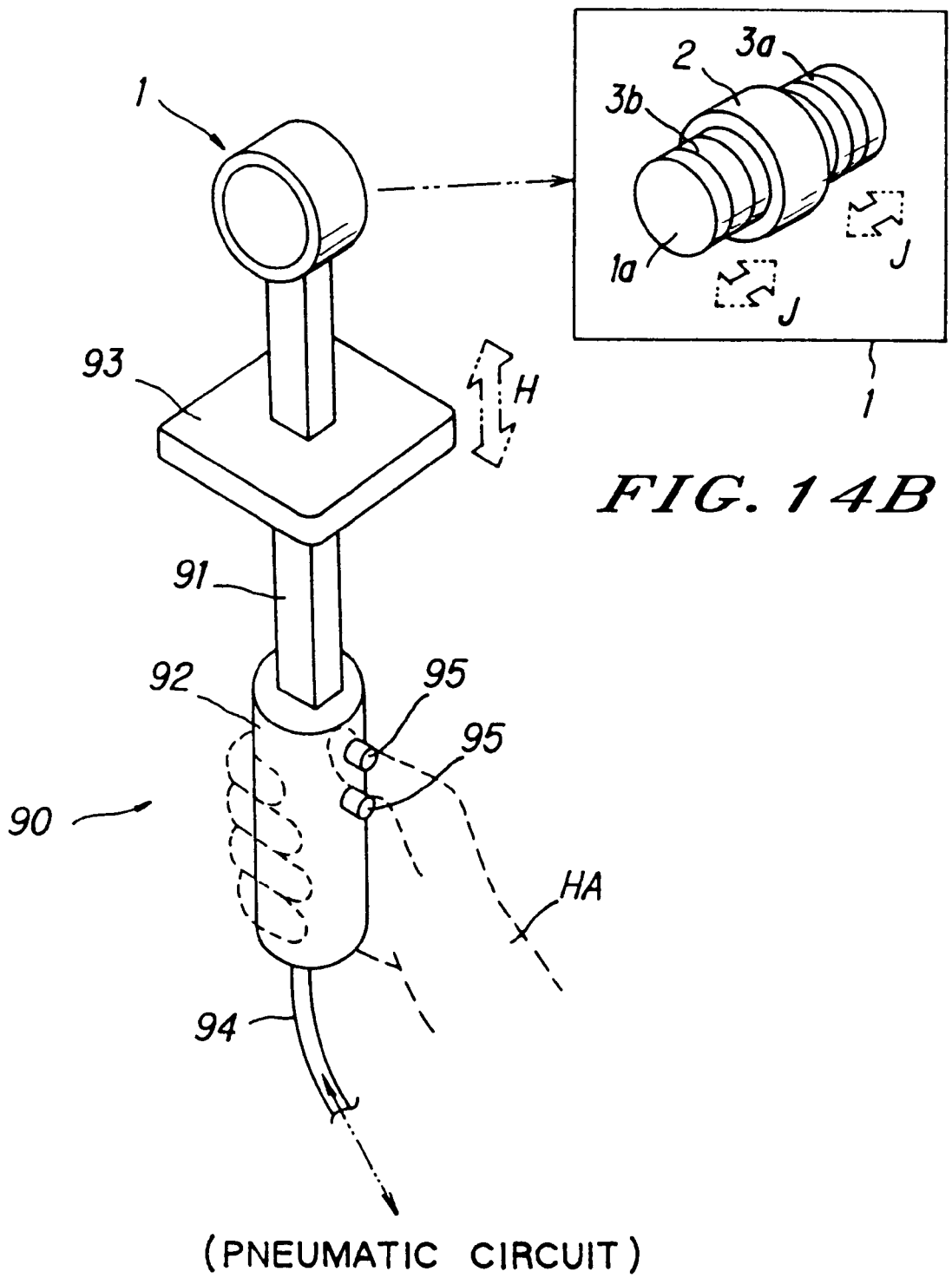
FIG. 14 is a schematic perspective view illustrating a whole construction of an inspection apparatus of a third embodiment.

In the inspection apparatus shown in FIG. 14, the same probe 1 as above is attached to a portable rod member 90. This rod member 90 comprises a rod 91 supporting the probe 1, a grip 92 arranged on the rear end side of the rod 91, a plate-shaped positional guide 93 fitted adjustably at an appropriate position in the axial direction of the rod 91, and a tube 94 connected to the rear end side of the rod 91. An air path of the probe 1 communicates to a separate pneumatic circuit (not shown) through an air path not shown in the rod and the tube 94. Remote-operating buttons 95 and 95 are provided at appropriate positions of the grip 92, are electrically connected to the pneumatic circuit.

Now, operations of this embodiment as a whole will be described below.

Assume that the rotor unit 130 is removed in the same manner as in the conventional method upon inspection of the stator winding 103 of the electric rotating machine. Upon removal, the axial position of the positional guide is previously adjusted on the basis of the measured position of the stator winding 103 (see direction H in the drawing). Then, the measuring operator inserts the probe 1 while holding the grip 92 by a hand.

Then, when the positional guide 93 hits the stator winding, the pneumatic circuit (supply circuit) by acting on the operating button 95 at this position to send air to the air path in the probe 1 through the tube 94 and the rod 91 and thus to cause the bellows 3a and 3b on the both sides of the base 2 to expand (see direction J in the drawing). Then, measurement of electrostatic capacity is started by pressing the measuring element 1a against the surface (measuring position) of the stator winding.

Upon completion of measurement, the pneumatic circuit (intake circuit) is operated by means of the operating button 95 to cause the bellows 3a and 3b to contract through the air path reversed to the above.

According to this embodiment, therefore, upon inspection, in the same manner as in the conventional method, carried out by removing the rotor unit from the stator unit, it is possible to accurately and relatively easily position the measuring element at a position of the stator winding at a certain depth, and to press the measuring element against the surface of the stator winding with a certain force, thus permitting remarkable improvement of operability of pressing.

FOURTH EMBODIMENT

The electrostatic capacity measuring apparatus of the stator winding of the present invention is formed by connecting a data analyzer to the measuring instrument not shown of the measuring element to at least any one of the apparatus configurations of the first and the second embodiments This data analyzer comprises, for example, a personal computer, and upon receipt of measured data of electrostatic capacity from the measuring instrument of the measuring element, carries out analysis and evaluation of such measured data by executing a previously set algorithm for evaluating electrostatic capacity.

In the measuring method using such an apparatus, the probe is guided toward the gap of the target stator winding by driving the foregoing arm unit, thereby positioning the same. The status is therefore adjusted by causing-the bellows of the probe to contract into a state in which the measuring element and the stator winding are mutually in non-contact. Electrostatic capacity in air between the both components is measured in this non-contact state by means of the measuring element as an initial value regarding the initial condition of the stator winding, and the measured value is sent to the data analyzer through the measuring instrument.

Then, the measuring element is brought into contact with the stator winding by causing the bellows of the probe to expand. In this state, electrostatic capacity is measured, and the measured value is sent to the data analyzer through the measuring instrument of the measuring element in the same manner as above.

According to this embodiment, therefore, in the measurement of electrostatic capacity of the stator winding, electrostatic capacity in the non-contact state of the measuring element and the stator winding is measured as an initial value. There is therefore an available advantage of grasping and evaluating the initial condition before measurement of each of the plurality of stator windings, and further improving accuracy and reliability of measured data.

In this embodiment, the present invention is applied to an automatic measuring instrument using an arm unit. The present invention is not however limited to this. For example, it is applicable also to a manual measuring instrument using a rod member as in the third embodiment.

FIFTH EMBODIMENT

Figure 15:
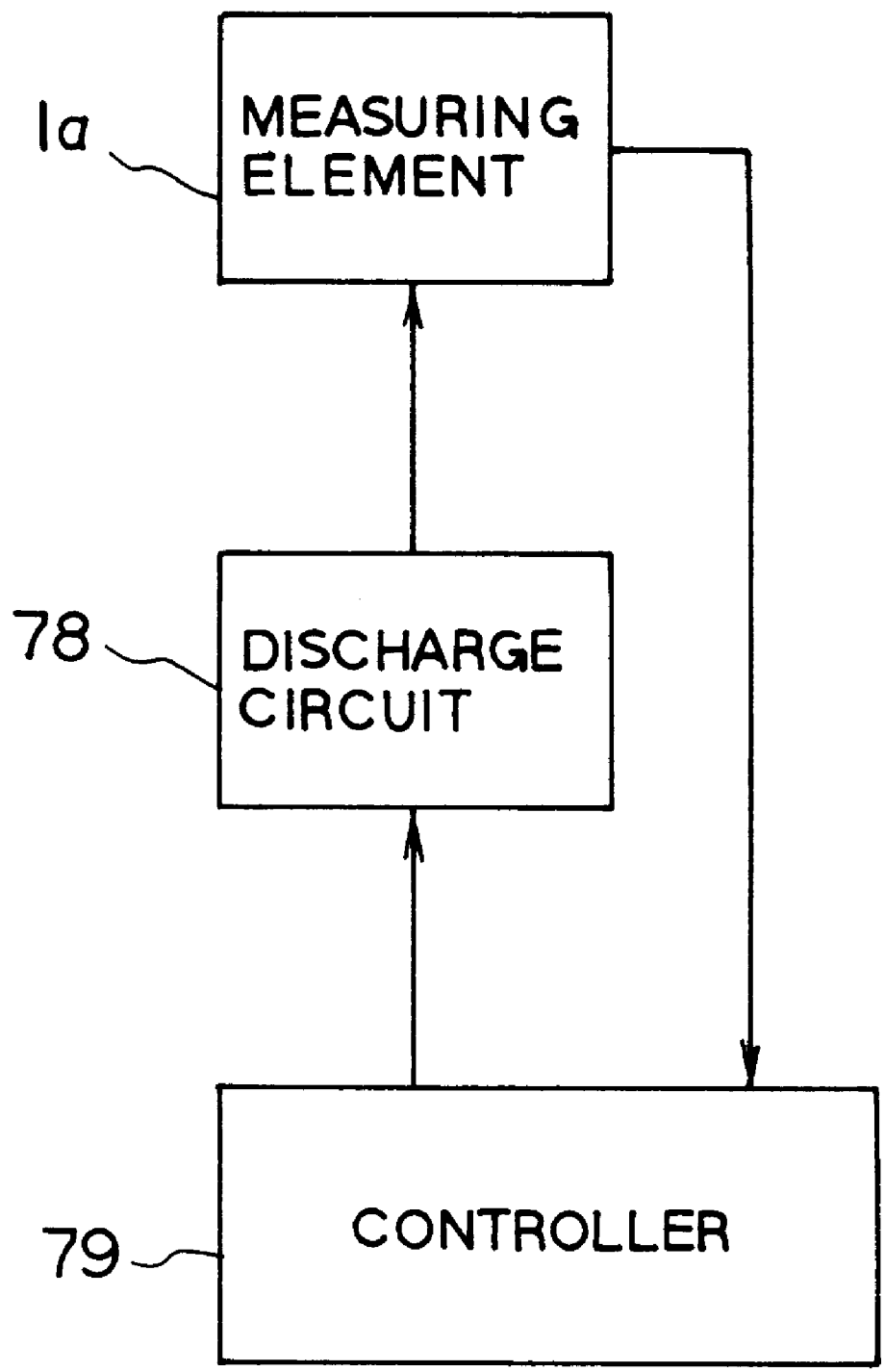
FIG. 15 is a schematic block diagram partially illustrating an apparatus provided with a discharge circuit of a fifth embodiment.

In the electrostatic capacity measuring instrument of the stator winding shown in FIG. 15, a discharge circuit 78 and a controller 79 for controlling operations thereof are connected to the measuring element 1a, in addition to at least any one of the apparatus configurations of the above embodiments (description omitted). The discharge circuit 78 temporarily performs short-circuiting of the connecting cable between the measuring element 1a and an electrostatic capacity input terminal of the measuring instrument not shown upon receipt of an instruction regarding discharge request from, for example, the controller 79, to a grounding terminal.

In this measuring instrument, the discharge circuit 78 is operated by issuing a discharge request instruction of the measuring element 1a from the controller 79 to the discharge circuit 78 before execution of measurement of electrostatic capacity, and charge of the measuring element 1a in the preceding run of measurement is discharged through the connecting cable.

According to this embodiment, therefore, upon measuring electrostatic capacity of the stator winding, charge of the measuring element is discharged before measurement. Each of a plurality of stator windings can be measured almost under the same conditions at least regarding charge, thus further improving accuracy of measured data.

SIXTH EMBODIMENT

In a electric rotating machine, of which the operating voltage is as high as about 20 kV, a treatment for reducing electric field intensity of the stator winding (prevention of corona) near the iron core end is usually applied. Particularly, a portion of several tens of mm from the iron core end is subjected to a treatment inhibiting low-resistance corona. Therefore, by measurement of electrostatic capacity of such a portion subjected to a low-resistance corona preventing treatment, an accurate value necessary to inspecting a stator winding can hardly be expected.

In this embodiment, therefore, when measuring electrostatic capacity of a stator winding, the measuring position should not be the corona preventing portion, but should preferably be the portion exposed to outside the machine from the iron core end, or more preferably, a position near the transition portion from straight to curved portions of the stator winding. By selecting a measuring position excluding the corona preventing portion, a plurality of stator windings can be measured under almost the same conditions at least regarding the effect of low-resistance corona preventing treatment, thus providing an advantage of further improving accuracy of measured data.

SEVENTH EMBODIMENT

In general, a electric rotating machine suffers from production of much stray electrostatic capacity, and is installed in an environment containing produced stray electrostatic capacity. When measuring electrostatic capacity of a stator winding, therefore, disregarding the effect of stray electrostatic capacity is not wise at all.

In this embodiment, therefore, there are adopted, as measuring conditions of electrostatic capacity of a stator winding, a measuring element capable of excluding produced stray electrostatic capacity, and an AC-type measuring instrument permitting correction of the effect of stray electrostatic capacity superposed on the measuring lead. For the measuring frequency, since the electrostatic capacity value to be measured is small and a frequency near the commercial one or a high frequency leads to easy oscillation, it is set in the proximity of 1 kHz with a small external stray electrostatic capacity.

Since the measuring conditions are selected so as to avoid the effect of external stray electrostatic capacity, it is possible, when measuring electrostatic capacity of a stator winding, to reduce a measuring error caused by stray electrostatic capacity and to obtain more accurate measured results.

EIGHTH EMBODIMENT

The electrostatic capacity measuring apparatus of this embodiment is provided with a surface condition inspecting system (not shown) for inspecting the surface condition of the contact portion between the measuring element and the stator winding, in addition to the same apparatus configuration as at least any one of the above-mentioned embodiments. When measuring electrostatic capacity by bringing the measuring element into contact with the stator winding through expansion of the bellows of the probe, this system simultaneously calculates a resistance value by means of a measuring instrument not shown and determines the contact state between the measuring element and the stator winding by the use of the measured resistance value, thereby inspecting the surface condition of the contact portion.

In this system, when a calculated resistance value is within a previously set range, the measuring element is in accurate contact with the stator winding. If the measured resistance value is near infinity, the measuring element is not in accurate contact with the stator winding, that is, it is determined that the surface of the stator winding contains irregularities, or the probability of such irregularities is high.

According to this embodiment, therefore, when measuring electrostatic capacity of a stator winding, it is possible to know the surface condition of the contact portion which cannot be visually observed before measurement, thus providing an advantage of previously avoiding measurement at a portion containing a defective surface condition, thus further improving reliability of a measured value.

As an example of application of this embodiment, a system which automatically detects a desired measuring position is making it possible to bring the measuring element accurately into contact with the stator winding. This system, in addition to a measuring instrument measuring the above-mentioned resistance value, positions the probe at a desired measuring position by driving the arm unit and the moving apparatus in response to the result of determination based on that resistance value.

Operation of this system is as follows. First, when it is determined that the measuring element is not accurately in contact with the stator winding, the bellows of the probe are caused to contract to arrange the measuring element in non-contact with the stator winding.

Electrostatic capacity and resistance value are therefore measured by moving the arm unit for each distance of several millimeters to the stator iron core side or to opposite side in the axial direction of the rotor unit, and then bringing the measuring element into contact with the stator winding through expansion of the bellows of the probe. These operations are repeated until the same travels for several cm. In the meantime, the operation is discontinued at the point when the measured electrostatic capacity and resistance value show values within previously set ranges, and the axial position at this moment are stored in a memory not shown in the system. This operation covers the case of the axial direction, and the steps are the same even for the radial direction of the rotor unit.

NINTH EMBODIMENT

Figure 16:
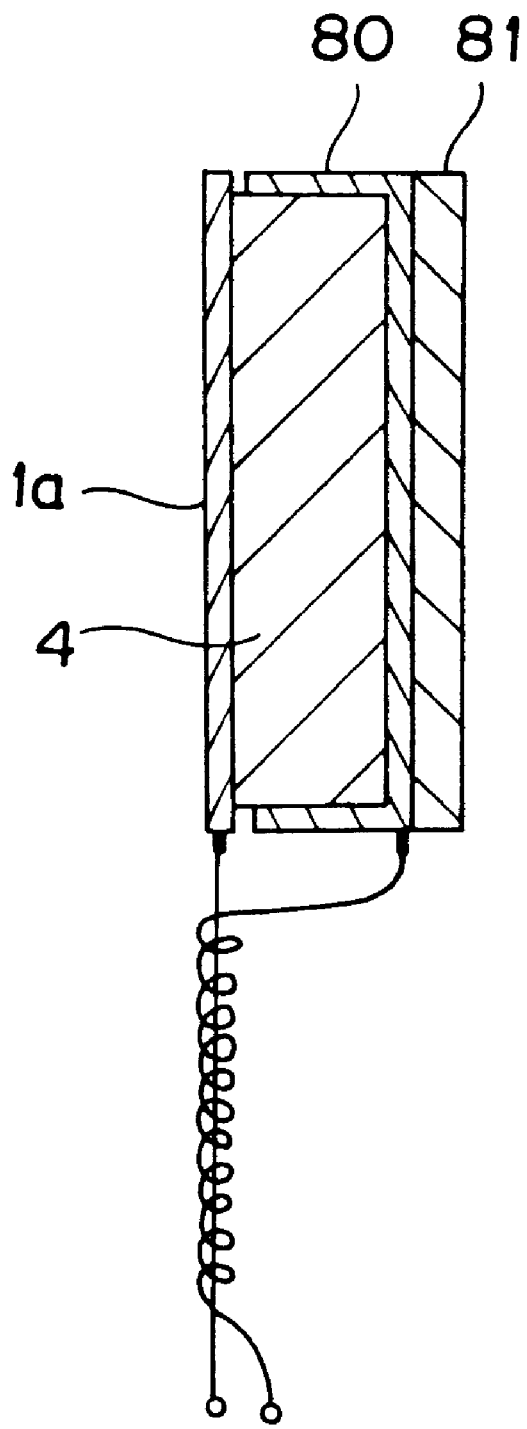
FIG. 16 is a schematic configuration diagram partially illustrating an apparatus of a ninth embodiment.

The electrostatic capacity measuring apparatus shown in FIG. 16 is formed by constructing a measuring element 1a from copper foil, applying the copper foil onto a surface of the cushion 4, affixing a guard 80 formed by copper foil so as to cover the other surface, providing an insulating plate 81 made of an insulating material such as an epoxy resin on the back side of this guard 80, and attaching the measuring element 1a through the insulating plate 81 to the same probe 1 as that mentioned above. The other components are substantially the same as above.

According to this measuring apparatus, in which the measuring element is provided with the insulating plate and the guard, it is possible to shield stray electrostatic capacity. Because of the cushion provided between the measuring element and the guard, the measuring element follows the surface condition of the stator winding, and it is thus possible to uniformly press the measuring element against the curved portion.

TENTH EMBODIMENT

Figure 17:
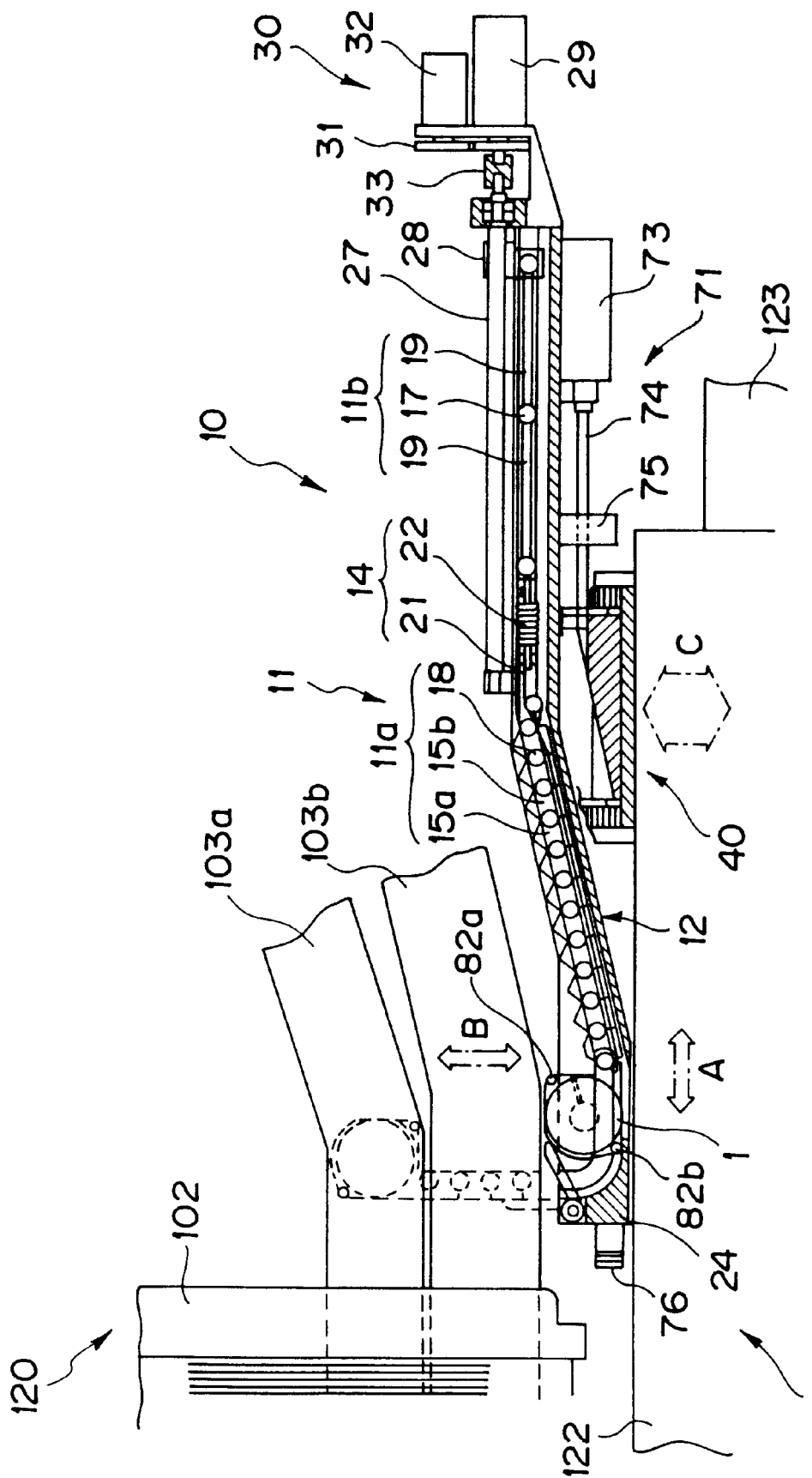
FIG. 17 is a schematic side view illustrating a whole view of an inspection apparatus of a tenth embodiment.

The inspection apparatus shown in FIG. 17 is provided with a positioning system which performs positioning of the probe 1 by detecting the coil width in the radial direction of the stator winding 103, in addition to the probe 1, the arm unit 10 and the moving apparatus 40 as described above (description omitted).

This positioning system comprises coil width detecting sensors 82a and 82b such as optical sensors mounted at two upper and lower positions in the probe 1, and a controller (not shown) which controls driving of the arm unit 10 on the basis of information regarding the coil width from these sensors 82a and 82b.

Operations of the system are as follows. First, when positioning the probe 1 to the measuring position of the stator winding 103a, the arm link section 11 of the arm unit 10 is caused to travel forward and upward under the control of the controller, and the upper edge of the stator winding 103a on the outside diameter side is detected by means of a sensor 82a provided on the upper part side of the probe 1. Subsequently, the arm link section 11 is caused to travel backward and downward, and the lower edge of the stator winding 103a is detected by means of a sensor 82b provided on the lower part side of the probe 1. The winding width in the radial direction of the stator winding 103b on the outside diameter side in the controller on the basis of a detection signal thereof, and the probe 1 is positioned by driving the arm unit 10 so that the center of width is at the measuring position. This operation is similarly carried out also for the stator winding 103b on the inside diameter side.

According to this embodiment, therefore, there is provided an advantage of accurately positioning the probe by determining the center for each of a plurality of stator windings, in addition to the same effects as above.

ELEVENTH EMBODIMENT

The inspection apparatus of this embodiment is provided with a positioning system which positions the probe in the gap of the stator windings on the basis of an image from a camera (see reference numeral 75a in FIG. 1) in addition to the probe, the arm unit and the moving apparatus as in the above case (description omitted). This system has an image processor which executes a previously set image processing algorithm by incorporating an image regarding the gap of the stator winding taken by the camera, and a controller which controls the circumferential driving of the moving apparatus on the basis of the result of processing by this image processor.

This system incorporates an image from the camera during travel of the moving apparatus in the circumferential direction, determines whether or not the incorporated image matches with a center image of the gap of the stator winding previously pattern-recognized, and if determined to be matching, discontinues the circumferential travel of the moving apparatus at this point.

According to this embodiment, therefore, it is possible to insert the probe along the center position of the gap of the stator winding and thus to avoid almost any inconvenience of collision of the probe with the stator winding.

As an example of application of this embodiment, a positioning system may be adapted, based on steps of pattern-recognizing an image with the image recorded in the preceding run of measurement, and discontinuing the circumferential travel of the moving apparatus at the point when these images are in agreement. In this case, even when measuring the same stator winding a plurality of times, it is possible to set the insertion slot of the probe at the same position every time, thus providing an advantage of further improving reliability of measured data.

TWELFTH EMBODIMENT

The inspection apparatus of this embodiment is provided with an arm unit, a moving apparatus, an instructed operation pendant (not shown), and circumferential travel limiter (not shown) as in the above-mentioned first embodiment (fifth example of application).

In this embodiment, when the operator manually moves the inspection apparatus, the mode should be switched over to the manual mode by means of the instructed operation pendant. At this point, the circumferential travel limiter limits the use of the circumferential motor in response to the state of arm housing. More specifically, if it is not housed in the arm unit, driving of the circumferential motor is prohibited by the instructed operation pendant, and the use of this motor is allowed only in a state in which the probe is housed in the arm unit. According to this embodiment, therefore, it is possible to avoid inconvenience in which circumferential travel is executed erroneously by the operator with a probe or the arm link section as inserted in the gap of the stator winding and it collides with the stator winding.

THIRTEENTH EMBODIMENT

Figure 18:
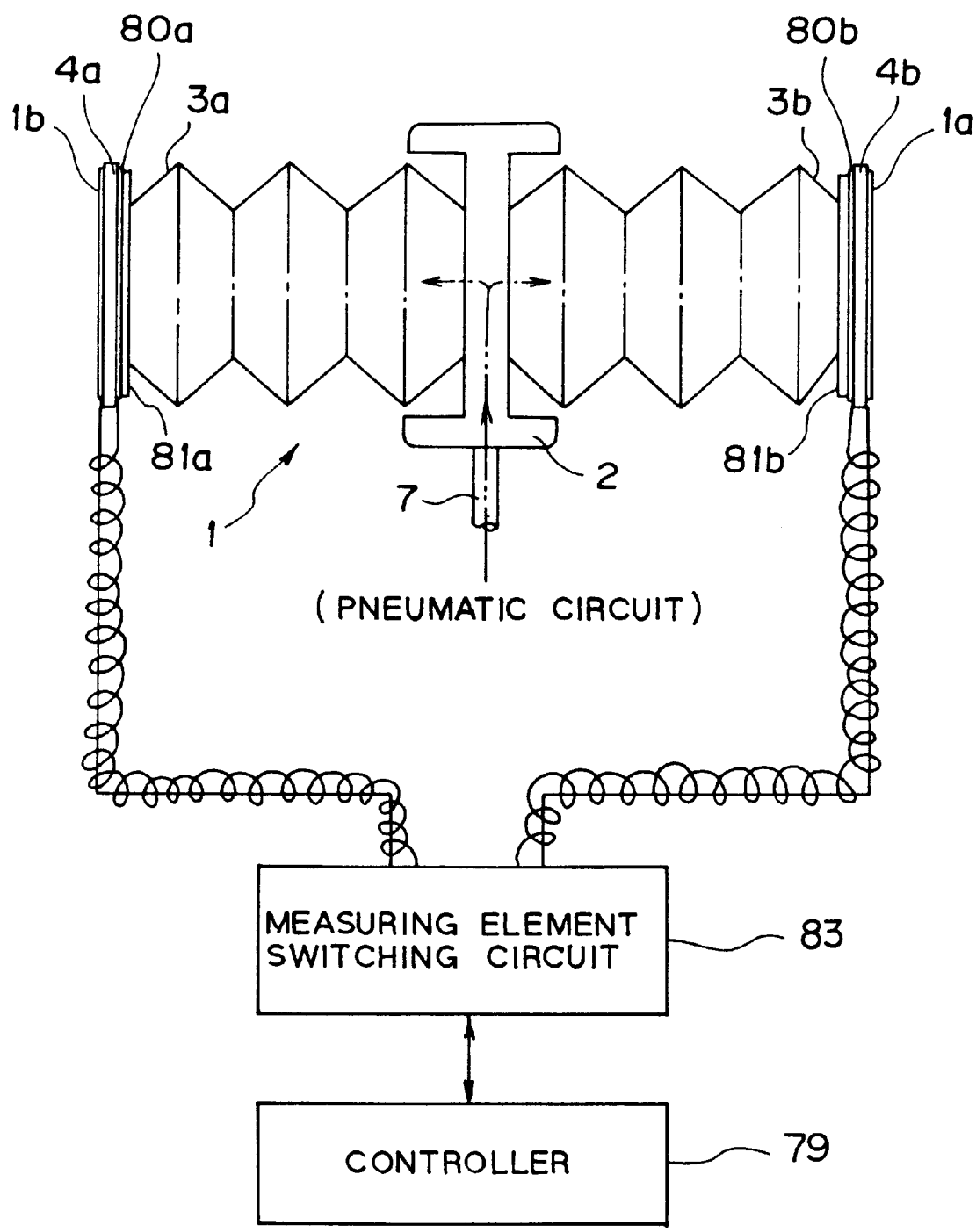
FIG. 18 is a schematic side view partially illustrating the construction of an inspection apparatus of a thirteenth embodiment.

The inspection apparatus shown in FIG. 18 has a construction in which the same insulator 81 and a guard 80 as those in the foregoing ninth embodiment, and measuring elements 1a and 1b via a cushion material 4 are attached on the outer surfaces of the bellows 3a and 3b on the both sides of the probe 1, and signal lines from the both are connected through a measuring element switching circuit 83 to a controller 79. The switching circuit 83 comprises relays and the like, and can switch over between the right and left measuring elements 1a and 1b in response to an instruction from the controller 79.

Operations of this apparatus are as follows. The probe 1 is moved to the measuring position, and electrostatic capacity of a measuring element 1a is measured through the switching circuit 83. Subsequently, electrostatic capacity of the other measuring element 1b is measured by means of the switching circuit 83. According to this embodiment, therefore, electrostatic capacity of two static windings can be measured at a measuring position, thus providing an advantage of further improving measuring efficiency.

FOURTEENTH EMBODIMENT

Figure 19:
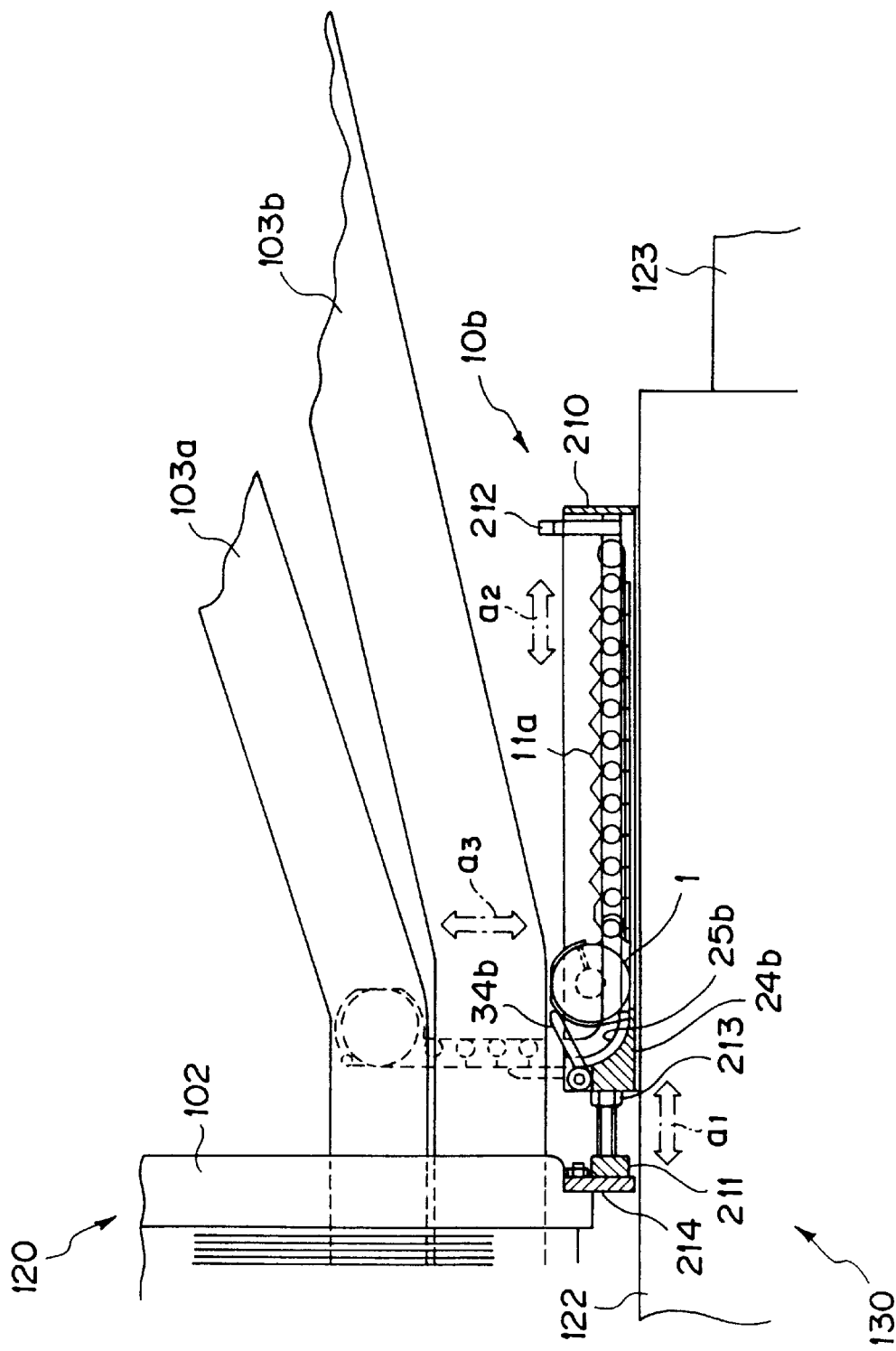
FIG. 19 is a schematic side view illustrating a whole construction of an inspection apparatus of a fourteenth embodiment.

The inspection apparatus shown in FIG. 19 is the application of the present invention to a manual type measuring apparatus in which the foregoing moving apparatus is omitted, and more specifically, is provided with a probe 1 and an arm unit 10b for arm-driving the same.

A transferable arm housing section (formed with substantially the same enclosure 24b as that in the above embodiment, a guide rail 25b and a vertical guide door 34b) 210 are provided in the arm unit 10b. The section 210 is used for housing substantially the same link assembly 11a as the above-mentioned leading end link assembly together with a probe 1 and guiding the arm driving of the same, an axial adjuster 211 using a nut capable of adjusting the position of the probe 1 in the axial direction relative to the stator winding 103, arranged on the leading end side of the arm housing section 210 and a radial adjuster 212 connected to the rear end of the link assembly 11a and capable of adjusting the radial direction of the probe 1 relative to the stator winding 103.

Operations of this apparatus are as follows. First, the nut 213 of the axial adjuster 211 is adjusted, and the position of a radial stopper not shown in the arm housing section 210 is previously aligned with the radial measuring positions of the stator windings in two stages 103a and 103b. Then, the arm housing section 210 is placed on the rotor unit 130 covered with a protecting sheet (not shown), and the axial adjuster 211 on the leading end side is pressed against a buffgaffle 214 on the stator iron core side to fix the axial position of the arm housing section 210 (see arrow al in the drawing).

Then, in a state in which the arm housing section 210 is manually held, the radial adjuster 212 is manually pressed (see arrow a2 in the drawing) to the position of the radial stopper, thereby causing the link assembly 11a to travel along the guide rail 25b. The probe 1 on the leading end side thereof is guided to the radial measuring positions of the two stage stator windings 103a and 103b, respectively (see arrow a3 in the drawing). Then, the bellows are caused to expand by applying a pneumatic pressure in the probe 1, and the measuring element 1a is brought into contact with the stator winding 103 for measurement of electrostatic capacity.

Upon completion of this measurement, the bellows are caused to contract by absorbing air in the probe 1, and the probe is housed in the arm housing section 210 by pulling the radial adjuster back to the original position. The arm housing section 210 is transferred to outside the generator, and the arm housing section 210 is caused to travel to the circumferential position of the rotor unit 130 looking out the stator windings 103a and 103b on the sides to be subjected to the next run of measurement. Then, the same steps as above are followed, and subsequently, all the stator windings 103 are measured by sequentially repeating these steps for the entire circumference.

According to this embodiment, therefore, even when the stator winding is inspected without pulling out the rotor unit from the stator unit, it is possible to accurately and easily position the measuring element to a gap between the stator windings and at a certain depth of the stator winding and to the same position at a certain distance from the iron core section, thus permitting remarkable improvement of operability of measurement.

FIFTEENTH EMBODIMENT

Figure 20:
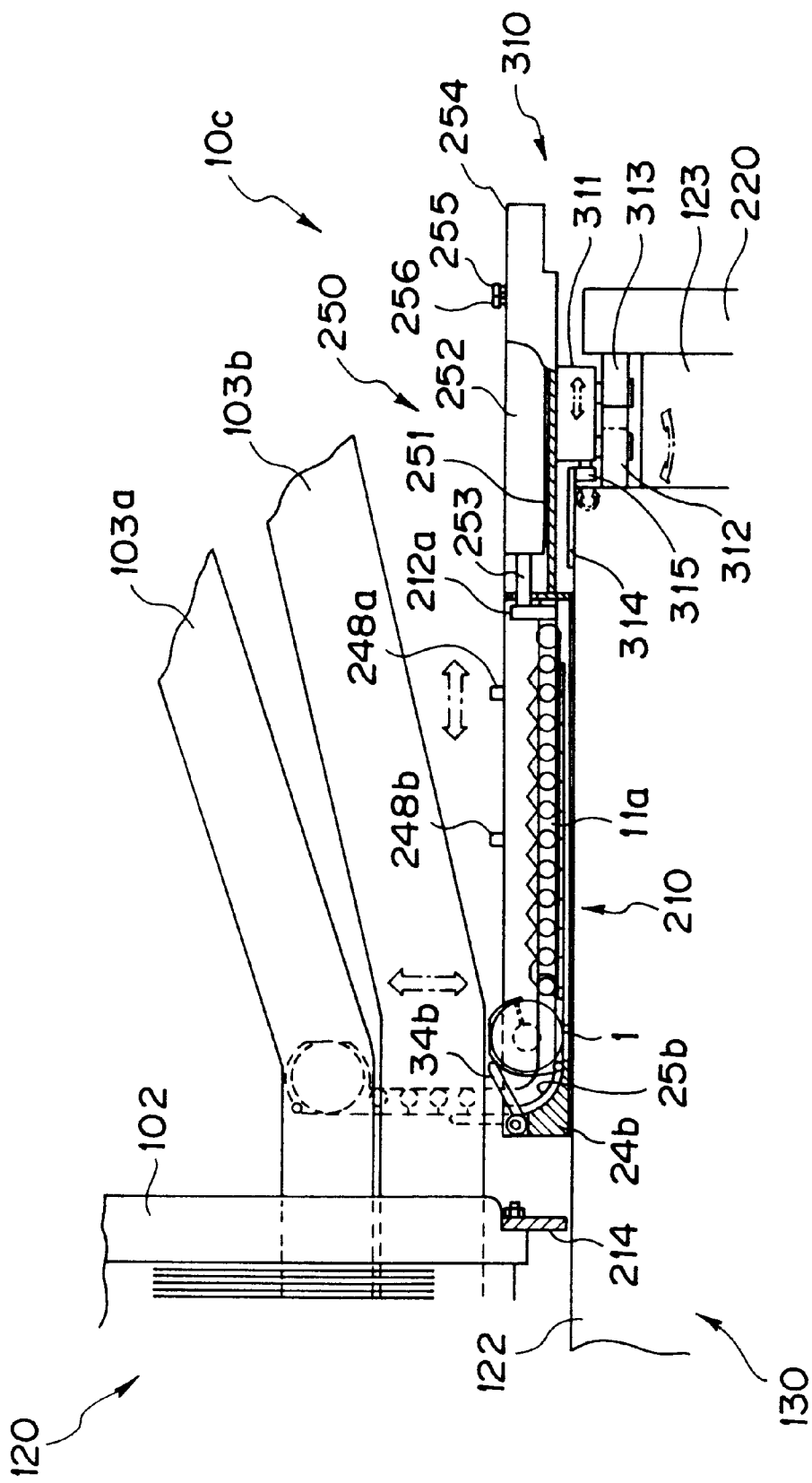
FIG. 20 is a schematic side view illustrating a whole construction of an inspection apparatus of a fifteenth embodiment.

The inspection apparatus shown in FIG. 20 is provided with a probe 1 and an arm unit 10c, as well as with a holding mechanism 310 which circumferentially movably holds the arm unit 10c through a recess space between a protecting ring 122 holding a rotation shaft 123 and a cooling fan attachment plate (flange) 220.

An arm housing section 210 mounting a link assembly 12a similar to that in the fourteenth embodiment and an air cylinder mechanism 250 (arm driving mechanism) for arm-driving the link assembly 11a are provided in the arm unit 10c. The arm housing section 210 is provided with a radial adjuster 212a at the rear end of the link assembly 209, and two-stage variable stoppers 248a and 248b in response to the radial measuring position of the two-stage stator windings 103a and 103b as stoppers thereof.

The air cylinder mechanism 250 has an enclosure 251 attached to the trailing end of the arm housing section 210. An air cylinder 252 is arranged in this enclosure 251, and a piston 253 thereof is connected to the radial adjuster 212a. This air cylinder mechanism 250 feeds air into the air cylinder 252 by operating an air cylinder switch 255 of an operating section 254 formed on the rear end side of the enclosure 251 and starts arm-driving of the link assembly 11a by causing the radial adjuster 212a of travel forward by the stroke of the piston. At a point when the radial adjuster 212 comes into contact with the two-stage variable stoppers 248a and 248b, respectively, arm-driving of the link assembly 11a is discontinued.

The holding mechanism 310 comprises a front/rear adjusting unit 311 attached to the enclosure 251 of the air cylinder mechanism 250 and performing fine adjustment as a whole, and a pair of transverse rollers holding the opposite surfaces of the protecting ring 122 and the flange 220 as a pair of roller running surfaces, movably in the circumferential direction, i.e. a stationary transverse roller 312 on the protecting ring 122 side and movable transverse roller 313 on the shaft 220 side. The arm unit 10 is held by moving the movable transverse roller 313 relative to the stationary transverse roller 312 between the protecting ring 122 and the flange 220 so that the movable transverse roller 313 stretches in the axial direction, thereby determining the initial axial position of the arm unit 10 by means of the both transverse rollers 312 and 313 and the front/rear adjusting unit 311.

This holding mechanism 310 has a belt 314 for preventing the arm unit from dropping, capable of being wound in the circumferential direction by projecting in the axial direction on the rotation shaft 123 side on the end surface of the protecting ring 122, and a circumferential roller 315 rotatably attached to the front/rear adjusting unit 311 with the rotation shaft 123 sides as the roller traveling surface. These components 314 and 315 prevent dropping of the arm unit 10 and facilitate travel thereof in the circumferential direction.

Now, operations in this embodiment as a whole will be described below.

First, the positions of the two-stage variable stoppers 248a and 248b are previously aligned with the measuring positions of the two-stage stator windings 103a and 103b, respectively. Then, the arm housing section 210 is placed on the rotor unit (protecting ring 122) 130 having a curing sheet (not shown) wrapped. The air cylinder 252 is piston-driven by pushing the air cylinder switch 255, and stopped by pressing the same against the variable stopper 248a on the rear end side, thereby guiding the probe 1 to a radial measuring position of the stator winding 103b on the inside diameter side. A probe opening/closing switch 256 provided in the operating section 254 is pressed to cause expansion by applying a pneumatic pressure in the probe 1, thus carrying out measurement of electrostatic capacity in the same manner as above.

Upon completion of measurement of electrostatic capacity of the stator winding 103b on the inside diameter side, the probe 1 is caused to contract by acting on the switch 255. Then, by operating the air cylinder 252 by pressing again the air cylinder switch 256, and pressing the same to the variable stopper 248b on the leading end side, the probe 1 is guided to the measuring position of the stator winding 103a on the outside diameter side. At this point, electrostatic capacity is measured by applying a pneumatic pressure through pressing of the switch 256 as in the case described above. Upon completion, probe 1 is caused to contract, and housed in the arm housing section 210, thus completing a run of measurement for a slot. Subsequently, the arm unit 10 is manually moved in the circumferential direction via a circumference roller 315 and the arm housing section 210 is manually guided to the slots over the entire circumference for measurement.

According to this embodiment, therefore, even when a stator winding is inspected without pulling out the rotor unit from the stator unit, it is possible to accurately and easily position the measuring element at a certain depth of the stator winding in a prescribed gap of the stator winding to the same position at a certain distance from the iron core end, thus permitting remarkable improvement of operability as to measurement.

SIXTEENTH EMBODIMENT

Figure 23:
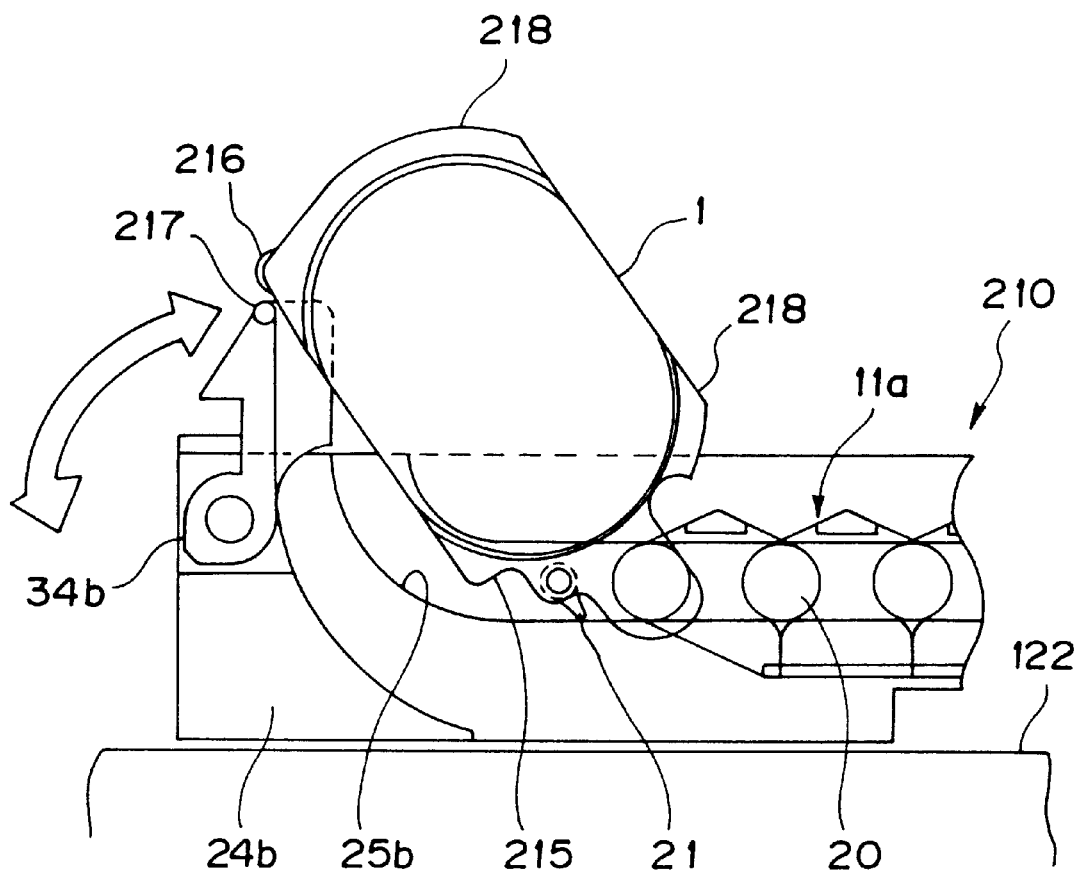
FIG. 23 is a schematic side view illustrating a construction of the leading end of an inspection apparatus.

Now, a sixteenth embodiment of the present invention will be described below with reference to FIGS. 21 and 23.

Figure 21:
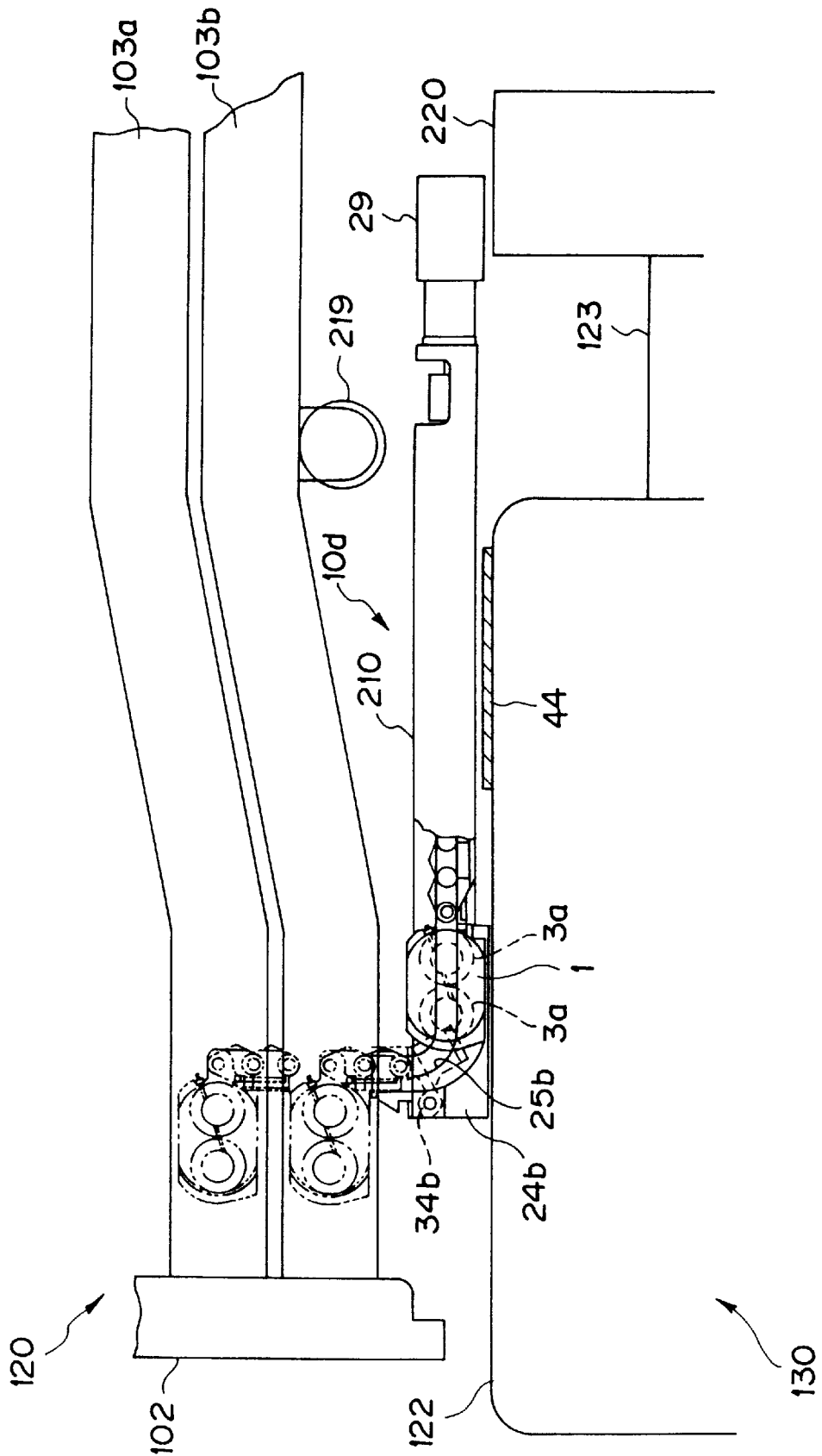
FIG. 21 is a schematic side view illustrating a whole construction of an inspection apparatus of a sixteenth embodiment.
Figure 22:
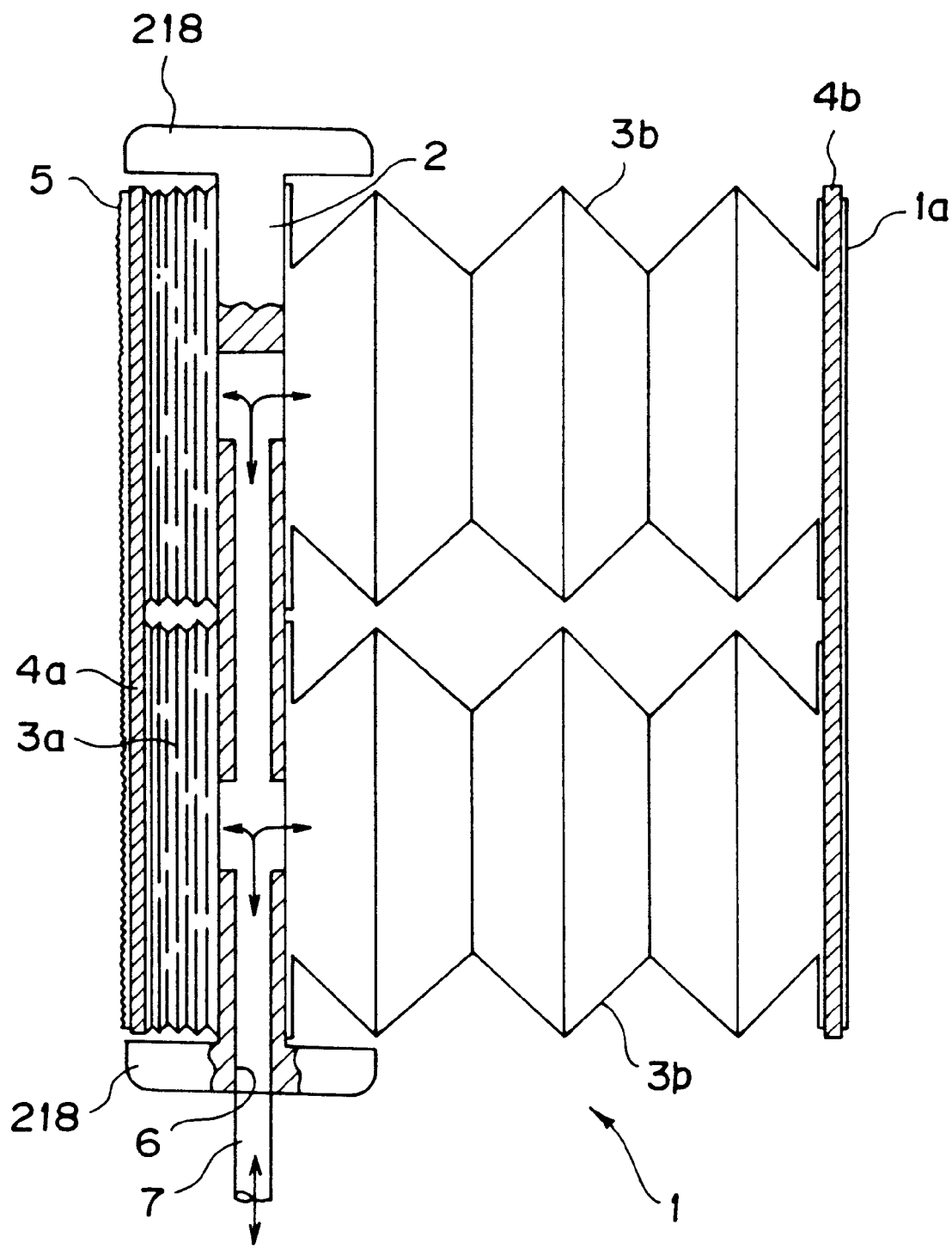
FIG. 22 is a schematic side view partially illustrating a construction of an oval-shaped probe of the multiple-bellows type.

The inspection apparatus shown in FIG. 21 is provided with a probe 1 and an arm unit 10d. As shown in FIG. 22, the probe 1 has two stage circular bellows 3a and 3b provided on the both sides, respectively, with a base 2 in between. A non-skid material 5 is attached through a cushion 4a to the outsides of the two-stage bellows 3a and 3a, and a measuring element 1a is attached through a cushion 4b to the outsides of the other two-stage bellows 3b and 3b. The probe as a whole is formed into an oval shape allowing further expansion of the contact area without protruding from the stator winding.

In this inspection apparatus, various components are added with a view to ensuring smooth guiding of the probe 1 to the stator winding 103 and positioning thereof along with the adoption of the oval probe of the multiple bellows type. For example, the probe 1 is provided, as shown in FIG. 23, with probe guards 218 for preventing contact damage on the both ends in the axial direction of the base 2, a horizontal guide 215 for securing the probe 1 at a prescribed angle at the measuring position between the stator windings 103, a probe wheel 216 for reducing resistance upon feeding the probe provided at the leading end of the probe 1, and a link wire 21 for giving tension by a spring not shown so as to guide the probe 1 in a certain direction.

The arm unit 10d has an arm housing section 210 for housing a link assembly 11a similar to the leading end link assembly described above, together with a probe a, and for ensuring smooth feed thereof, and an arm driving mechanism mounting an arm housing motor 29 for arm-driving the link assembly 11a for this arm housing section 210. An enclosure 24b of the arm housing section 210 is set to a size capable of being installed in a gap between a nose ring 219 securing the end of the stator winding 103 and a rotor unit 130. A guide rail 25b similar to that in the above case, a vertical guide door 34b and a guide wheel 217 for reducing resistance upon feeding the probe to the leading end of the vertical guide door 34b are attached to the enclosure 24b.

Now, operations of this embodiment as a whole will be described below.

First, the probe 1 is sent out from the vertical guide door 34b while moving the link assembly 11a along the guide rail 25b by the drive of the arm housing motor 29. This is smoothly accomplished with a guide wheel 217 and a probe wheel 216.

The probe 1 receives tension of a link wire 21 upon passing through the vertical guide door 34b and rotates around the connecting shaft with the link assembly 11a, and discontinues rotation at the point when a horizontal guide 215 comes into contact with the bottom surface of the link assembly 11a. The stop position of the probe 1 is at a point where the base axis of the probe 1 corresponds to a direction substantially at right angles to the arm axis of the link assembly 11a, i.e., a direction parallel to the axial direction of the stator winding 103a.

The probe 1 feeds while maintaining the horizontal posture is protected by a probe guard 218, so that it is guided without suffering from contact damage with the stator winding 103 and positioned at the measuring position.

Then, electrostatic capacity is measured by the probe 1. At this point, the two-stage bellows 3a and 3b, having a circular shape, expand almost uniformly, and brings the oval-shaped measuring element 1a into contact with the stator winding 103 to start measurement. Upon completion of measurement, the probe 1 is housed in the arm housing section 210. This probe housing is smoothly accomplished by means of a guide wheel 217 and a probe wheel 216 as in feeding thereof.

According to this embodiment, therefore, the measuring element is made larger in size in an oval shape so as to achieve a larger contact area without coming off the stator winding. It is therefore possible to increase the measuring reference value to minimize factors causing a measuring error such as noise, and thus to further improve the measuring accuracy. In the construction of this embodiment, the probe is kept in a horizontal posture relative to the rise-up posture of the arm. The probe can therefore be guided in parallel with the upper and lower stator windings, respectively, and as a result, operability for measurement can be remarkably improved.

Because a plurality of circular bellows are combined, there is provided another advantage of uniformly applying a pneumatic pressure to the bellows and ensuring stable expansion of the measuring element than in a case with a single bellows.

SEVENTEENTH EMBODIMENT

Now, a seventeenth embodiment of the present invention will be described below with reference to FIGS. 24 and 25.

Figure 24:
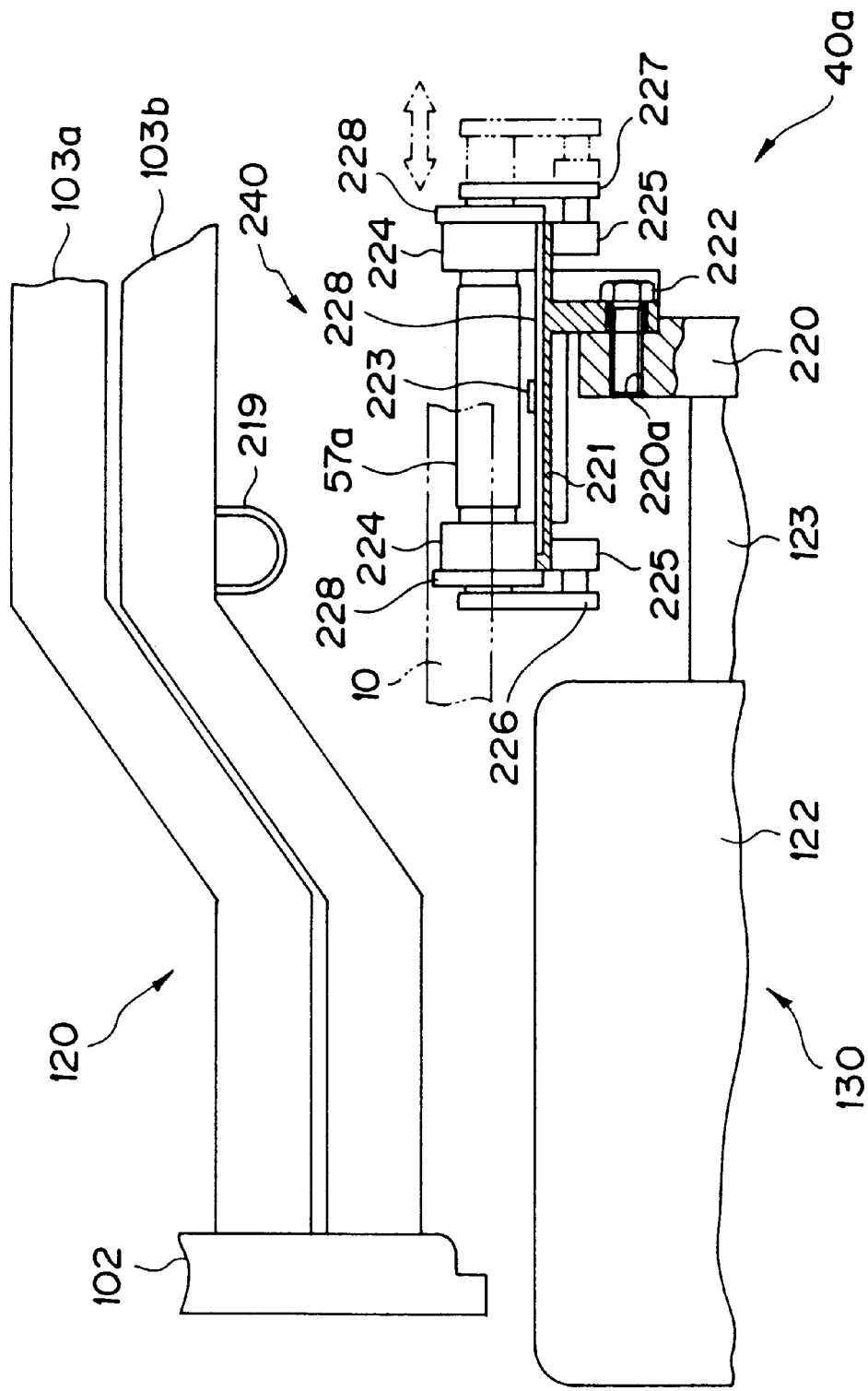
FIG. 24 is a schematic side view partially illustrating an inspection apparatus of a seventeenth embodiment.
Figure 25:
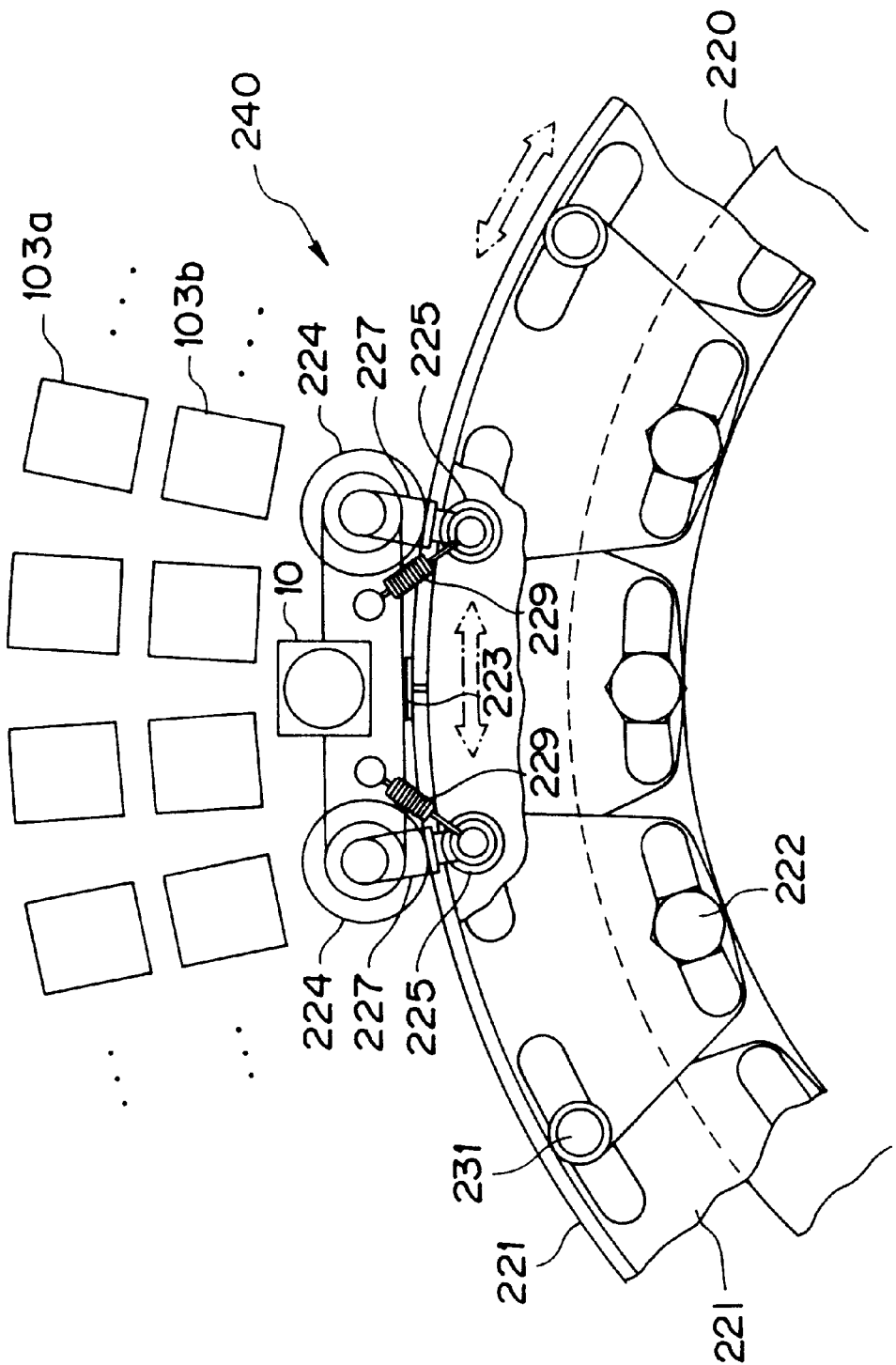
FIG. 25 is a schematic plan view partially illustrating a cylinder face circumferential moving apparatus.

The electrostatic capacity measuring apparatus shown in FIG. 24 is provided with a cylinder face circumferential moving apparatus (cylinder track measuring apparatus) 40a attachable to a flange 220 for a cooling fan for cooling a stator winding 103 or a rotor unit 130.

This moving apparatus 40a has a cylindrical track base 221 attached to the radial outside of a flange 220, a strip-shaped track guide 228 supported and secured by the base 221 through a track fixer in a state in which it is wound around the outside surface (upper surface) in the radial direction of the base 221, and a moving member 240 which causes an arm unit 10 along a circumferential track of the rotor unit 130 secured by the track guide 228.

The track base 221 is formed so as to be capable of coping even with a deformed cooling fan flange having a different exterior shape through adjustment of a circumference adjuster 231 using a pin joint mechanism, and attached through a plurality of fan fitting holes 220a on an axial side of the flange 220 by means of a plurality of fan bolts 222.

The moving member 240 has a body 57a substantially identical with the above-mentioned moving apparatus body 57. Driving wheels 224 . . . 224 are provided on this body 57a, and driven wheels 225 . . . 225 are connected through a fixed link or a sliding link 227 at opposite positions with the track guide 228 in between. The sliding link 227 is provided diagonally to the fixed link 226, and can be attached while housing the moving member 240 from the track guide 228. A tensioner 229 for producing frictional force by pulling up the wheels 224 onto the track guide 228 side is provided between the body 57a and the driven wheels 225.

When installing this moving member 40a on the rotor unit 130, the track base 221 is first attached to the entire circumference of the cooling fan flange 220 through adjustment of the pin joint mechanism. The track guide 228 is wound on the upper surface of the base 221. Then, the moving member 240 is placed on the track guide 228 at a position where the sliding link 227 has been housed. It then suffices to act on the tensioner 229 by inserting the sliding link 227.

According to this embodiment, therefore, it is possible to measure all the circumference by securing the track guide on the cooling fan flange, and hence to considerably improve operability regarding measurement.

EIGHTEENTH EMBODIMENT

Now, an eighteenth embodiment of the present invention will be described below with reference to FIGS. 26 and 27.

Figure 26:
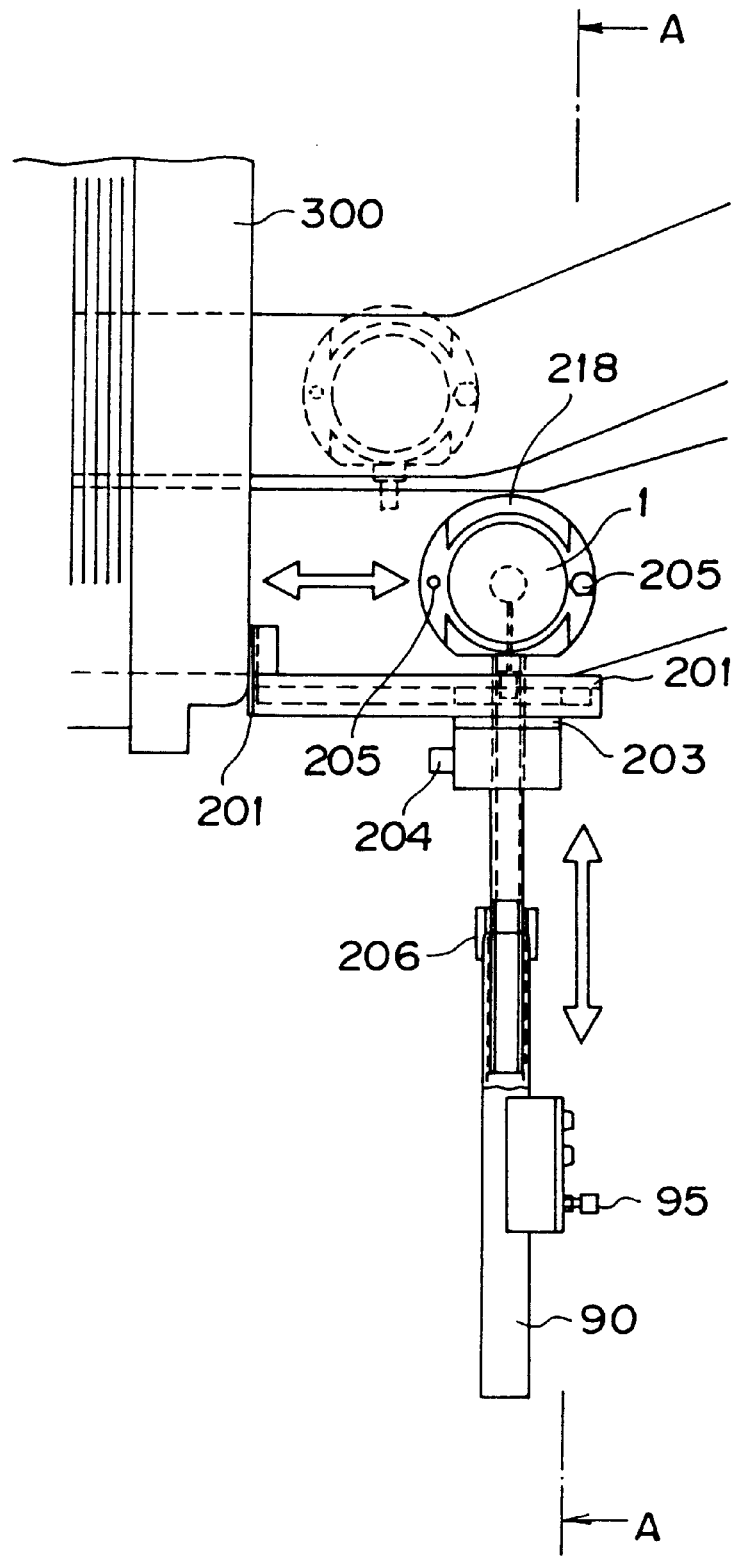
FIG. 26 is a schematic side view illustrating a whole construction of an inspection apparatus of an eighteenth embodiment.
Figure 27:
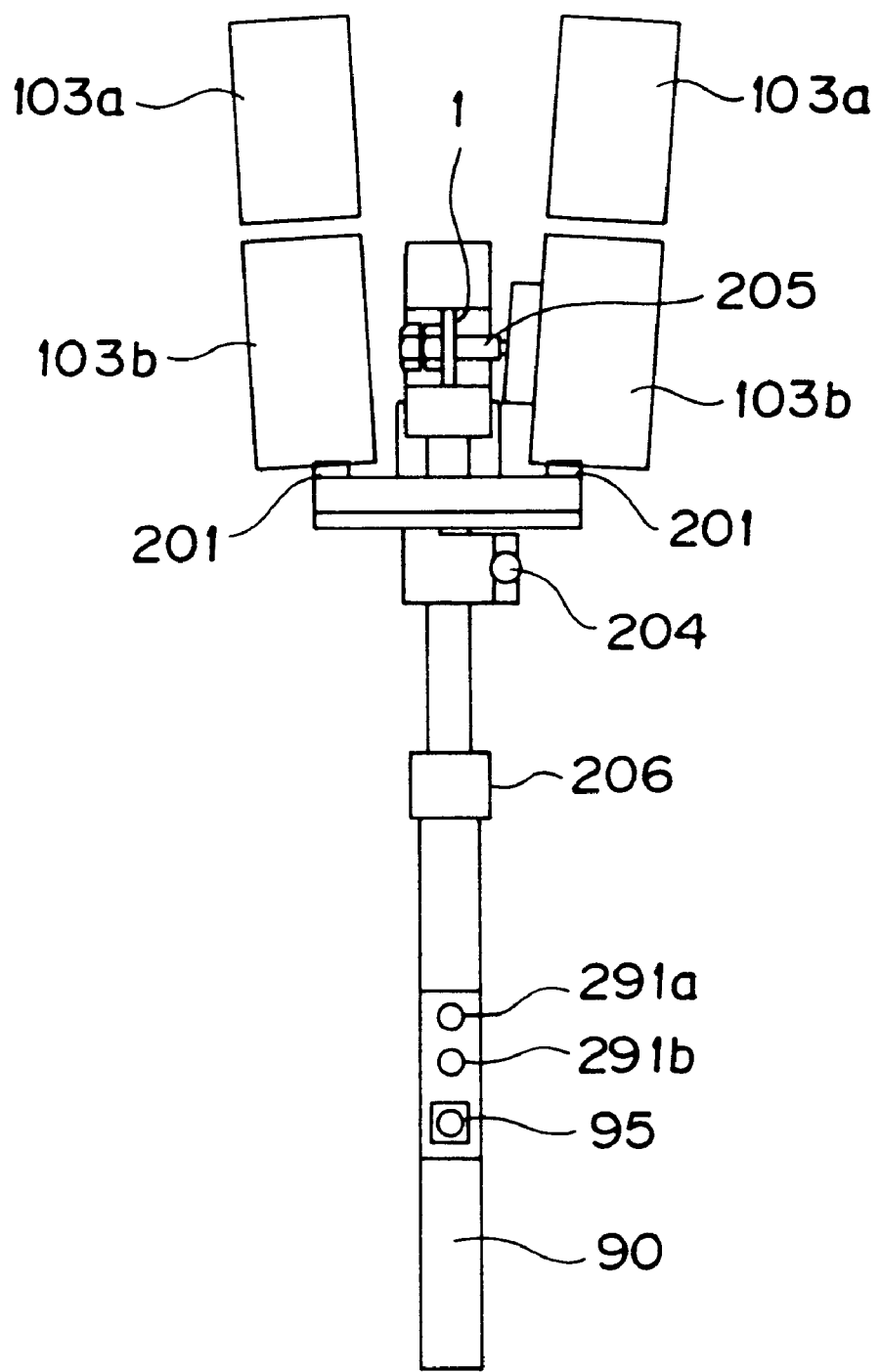
FIG. 27 is a schematic plan view of an inspection apparatus of FIG. 26 as viewed along the line A—A.

The inspection apparatus shown in FIGS. 26 and 27 is a portable type manual narrow portion measuring apparatus used when inspecting a stator winding 103 by removing a rotor unit 130 as in the above-mentioned third embodiment, and has a probe 1 of substantially circular shape to which a measuring element is attached through an expansible bellows, and a portable universal rod 90 supporting the probe 1.

A probe guard 218 for preventing contact damage or the like occurring upon inserting into the stator winding 103 is provided on the edge of the probe 1. Circumferential positioners 205 and 205 formed by nuts and bolts having a plurality of free faces are attached to two points on the edge of the probe 1. This positioner 205 keeps a constant circumferential distance by pressing the free face thereof against the side of the stator winding 103, and performs circumferential positioning by following the curved portion of the winding 103.

An adjusting nut 206 for freely adjusting the length, an axial positioner 203 and a radial positioner 204 on the probe 1 side (reference numeral 201 in the drawing represents the cushion), an operating button 95 for carrying out operation regarding expansion and contraction of the probe 1 and displays 291a and 291b thereof on the grip side are provided on the universal rod 90.

Operations of this embodiment as a whole will be described below.

First, the adjusting nut 206 and the various positioners 203 to 205 are previously adjusted before insertion of the probe 1 into the stator winding 103 in response to a desired measuring position of the stator winding 103. For example, the length of the rod member 90 is adjusted by means of the adjusting nut 206 in response to the size of the stator winding 103; the set size of the axial positioner is based on that of the iron core support 300; the set distance of the radial positioner 204 is based on the position of the end of the stator winding 103 in a state in which the rod member to be connected to the axial positioner 203 is held; and the set position of the circumferential positioner 205 is aligned with the measuring position between the stator windings 103.

The probe 1 is contracted by acting on the operating button 95, and inserted into the gap of the stator windings 103. Because the probe guard 218 permits avoidance of catch with the stator windings 103, probe insertion is smoothly accomplished, and completed when the positioners 203 to 205 come into contact with the stator windings 103.

Once the probe 1 is positioned, the probe 1 is caused to expand by acting on the operating button 95. After confirming that a prescribed pressure is reached from a change in color of the displays 291a and 291b, measurement of electrostatic capacity is started. Upon completion of this measurement, the operating button 95 is pressed again to cause contraction of the probe 1, and subsequently, these operations are conducted for the remaining stator windings 103.

According to this embodiment, therefore, even when carrying out inspection by pulling out the rotor unit from the stator unit, it is possible to accurately and easily position the measuring element at a certain depth of the stator windings, at the same position at certain distance from the stator windings and the iron core end, thereby further improving operational efficiency.

While a circular probe is used in this embodiment, the present invention is not limited to this. For example, an oval probe (substantially circular) as in the above-mentioned sixteenth embodiment may be adopted. In this case, combination of a plurality of stages of circular bellows permits achievement of a further larger contact area of the measuring element with the stator windings, and there is available an advantage of further improving the measuring accuracy by reducing the effect of factors causing a measuring error such as noise with a higher measuring reference value.

NINETEENTH EMBODIMENT

Figure 28:
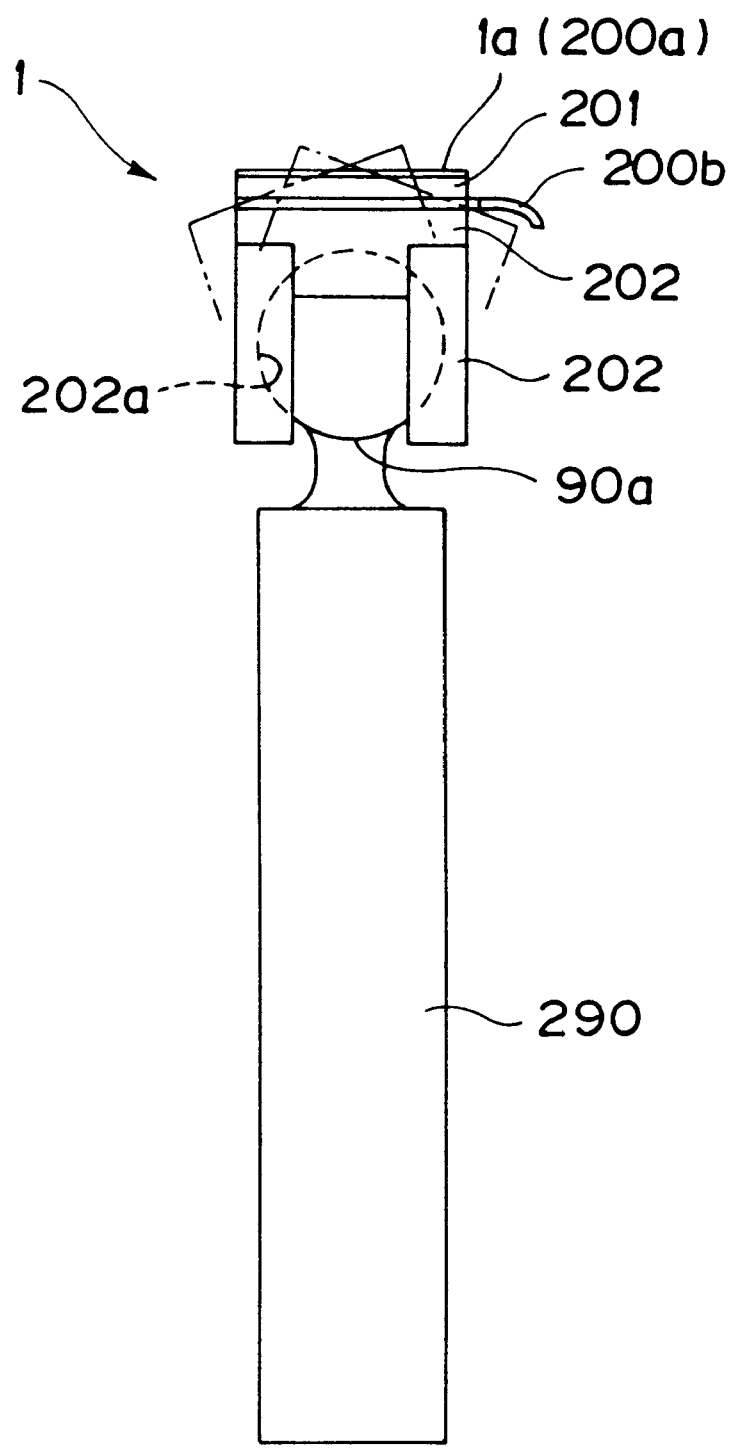
FIG. 28 is a schematic side view illustrating a whole construction of an inspection apparatus of a nineteenth embodiment.
Figure 29:
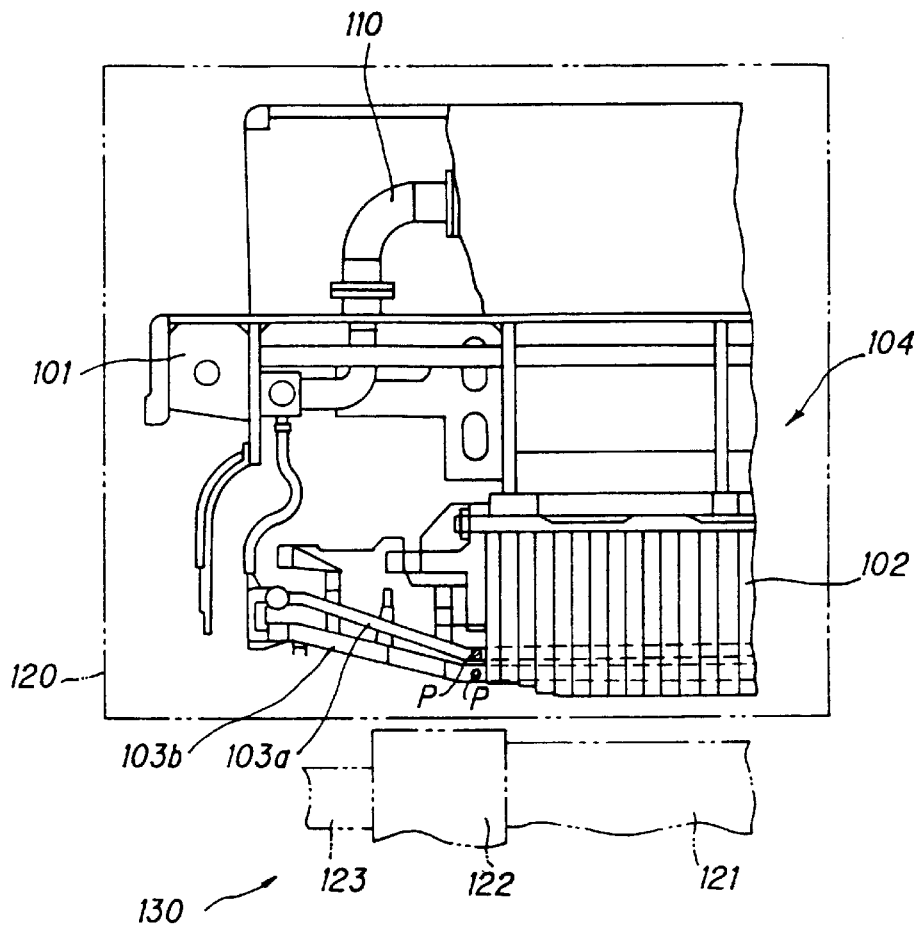
FIG. 29 is a schematic longitudinal sectional view partially illustrating a construction of a conventional electric rotating machine.
Figure 30:
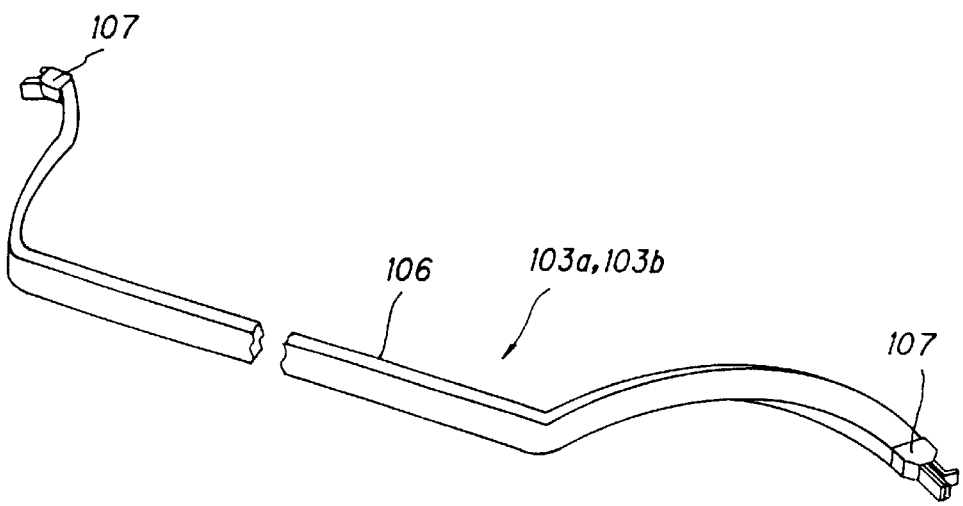
FIG. 30 is a schematic perspective view illustrating an exterior view of a conventional stator winding.
Figure 31:
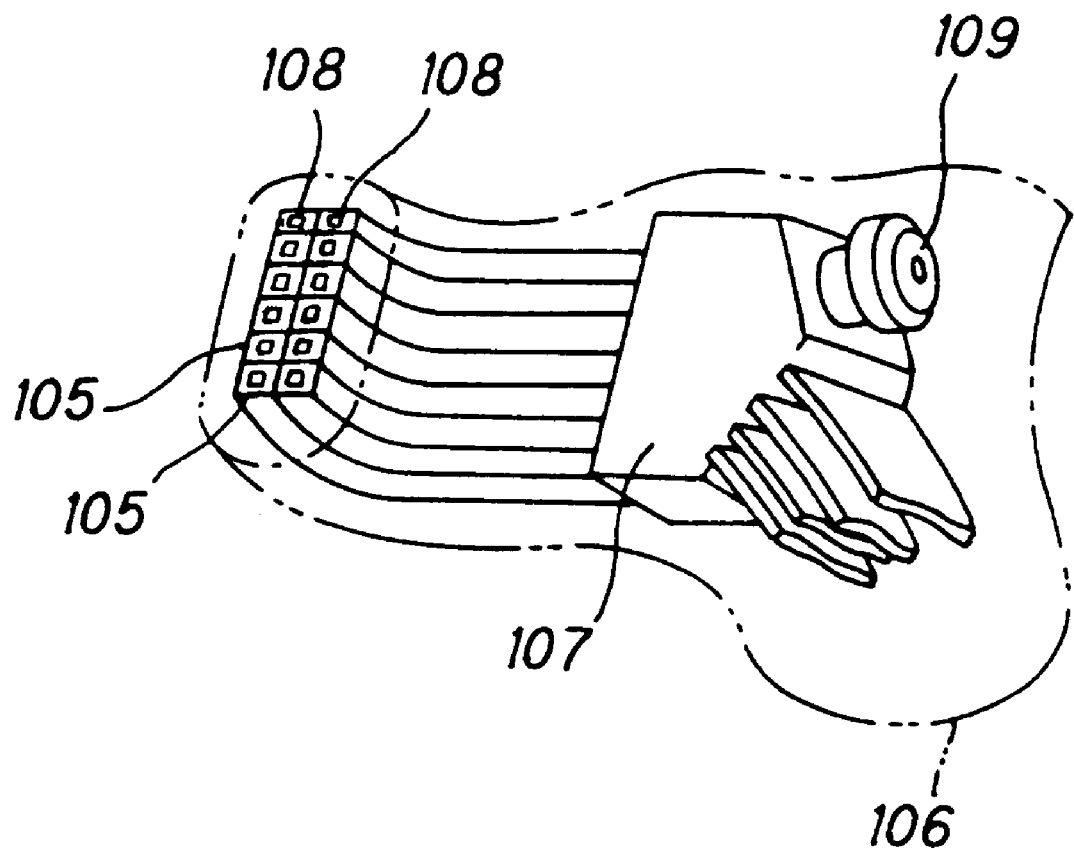
FIG. 31 is a schematic sectional view partially illustrating a construction of a conventional stator winding.

The inspection apparatus shown in FIG. 28 is a portable type manual narrow portion measuring apparatus and has a probe 1, and a portable measuring rod (rod member) 90 supporting the same. The probe 1 is attached rockably forward/rearward and right/left through a spherical convexity (probe attaching portion) 90a for joint provided at the leading end of the measuring rod 90.

The probe 1 is formed by constructing the measuring element 1a from copper foil 200a, applying the same to a surface of a cushion material 201, attaching an insulating plate 202 onto the other surface of the cushion material 201 through grounding copper foil 200b, and forming a spherical recess 202a engageable with the spherical convexity 90a to form a joint in the plate 202.

According to this embodiment, therefore, the probe is rockably attached at the leading end of the measuring rod, and Oit is possible to bring the probe into contact more accurately with the stator winding without being restricted by the position (posture) of the measuring rod. The cushion material provide another advantages of bringing the measuring element into close contact so as to follow the surface of the stator winding. This effect can be maximum when guiding the measuring element into a place where stator windings and the like form a complicated shape and bringing the same into contact with the stator windings.

What is claimed is:

1. An inspection apparatus for a structure with a gap comprising:

at least one measuring element configured to obtain data associated with performance of the structure;

an arm body configured to support the at least one measuring element, the arm body comprising an arm link assembly which includes a plurality of interconnected links; and means for inserting the arm body into the gap, thereby to set the measuring element at a measuring position.

2. An inspection apparatus according to claim 1, wherein the plurality of interconnected links forms a frame.

3. An inspection apparatus according to claim 1, wherein the inserting means comprises:

an arm moving element configured to move the arm link assembly into the gap and project the arm link assembly toward a measuring position; and an arm posture keeping element configured to keep the arm link assembly in a linear posture.

4. An inspection apparatus according to claim 3, wherein the plurality of interconnected links are flexibly interconnected.

5. An inspection apparatus according to claim 3, wherein:

the plurality of interconnected links includes a leading section of interconnected links and a trailing section of interconnected links; and the arm posture keeping element comprises a first cable having one end attached to the leading section of interconnected links and running through the leading section of interconnected links, and an elastic member attached to another end of the first cable and the trailing section of interconnected links.

6. An inspection apparatus according to claim 3, wherein:

the plurality of interconnected links includes a leading section of interconnected links and a trailing section of interconnected links; and the arm posture keeping element comprises a leaf spring having one end attached to the leading section of interconnected links and an other end attached to the trailing section of interconnected links, the leaf spring running through the plurality of interconnected links.

7. An inspection apparatus according to claim 3, wherein the arm posture keeping element comprising:

a plurality of pulleys which are rotatably provided on a respective link of the plurality of interconnected links; and a plurality of belts guiding the plurality of pulleys.

8. An inspection apparatus according to claim 3, wherein the arm posture keeping element comprises:

a device configured to maintain a position of the at least one measuring element after the arm link assembly is projected toward the measuring position.

9. An inspection apparatus according to claim 3, wherein the arm moving element comprises:

a guide configured to direct the arm link assembly; and a driving mechanism configured to move the arm link assembly along the guide.

10. An inspection apparatus according to claim 9, wherein the driving mechanism comprises:

a sliding mechanism configured to slide the arm link assembly along the guide.

11. An inspection apparatus according to claim 10, wherein the sliding mechanism includes a feed screw mechanism.

12. An inspection apparatus according to claim 3, wherein the arm body is configured to be inserted in a gap between a cylindrical rotor body and a stator body surrounding an outer peripheral of the cylindrical rotor body in an electric rotating machine in a non-contact fashion and to position the at least one measuring element at a measuring position in contact with a surface of a stator winding of a plurality of stator windings arranged radially around the cylindrical rotor body and supported by a stator core in the stator body, and the at least one measuring element is configured to measure an electrostatic capacity associated with the stator winding.

13. An inspection apparatus according to claim 12, wherein the arm moving element comprises:

means for detecting a coil width of the plurality of stator windings; and means for determining the measuring position on the stator winding based on the coil width.

14. An inspection apparatus according to claim 12, wherein the arm moving element comprises:

means for positioning the at least one measuring element to a location of the stator winding.

15. An inspection apparatus according to claim 1, wherein the arm body is configured to be inserted in a gap between a cylindrical rotor body and a stator body surrounding an outer peripheral of the cylindrical rotor body in an electric rotating machine in a non-contact fashion and to position the at least one measuring element at the measuring position in contact with a surface of a stator winding of a plurality of stator windings arranged radially around the cylindrical rotor body and supported by a stator core in the stator body, and the at least one measuring element is configured to measure an electrostatic capacity associated with the stator winding.

16. An inspection apparatus according to claim 15, further comprising:

means for measuring an electrostatic capacity of the at least one measuring element before the at least one measuring element comes in contact with the stator winding.

17. An inspection apparatus according to claim 15, further comprising:

means for discharging a charge on the at least one measuring element before a measurement of electrostatic capacity.

18. An inspection apparatus according to claim 15, wherein a scope of the measuring position is limited to a surface area of the stator winding from where the stator core ends to where the stator winding is exposed to an outside of the electric rotating machine and excludes an area subjected to a corona preventing treatment.

19. An inspection apparatus according to claim 15, wherein the at least one measuring element is configured to measure the electrostatic capacity at a measuring frequency of approximately 1 kHz.

20. An inspection apparatus according to claim 15, wherein the inserting means comprises:

a traveling system configured to move the at least one measuring element along an axis of the cylindrical rotor body to the measuring position on the stator winding, the traveling system comprising a servo motor and means for deactivating the servo motor during a measurement of electrostatic capacity.

21. An inspection apparatus according to claim 20, wherein the deactivating means comprises:

means for setting a rotation angle of a rotor in the servo motor to an electrically non-detectable state during the measurement of electrostatic capacity.

22. An inspection apparatus according to claim 15, further comprising:

a measuring instrument configured to measure a resistance generated by a contact between the at least one measuring element and the stator winding.

23. An inspection apparatus according to claim 22, further comprising:

means for determining the measuring position on the stator winding based on a measurement of the resistance.

24. An inspection apparatus according to claim 15, further comprising:

a probe body including a base and supported by the arm body;

at least one expansible bellow attached to the base and holding the at least one measuring element; and means for supplying and withdrawing air in the at least one expansible bellow.

25. An inspection apparatus according to claim 24, wherein the at least one measuring element comprises:

a cushion material;

a first copper foil applied to one side of the cushion material; and a second copper foil for grounding applied to an opposite side of the cushion material, and the probe body attached to the second copper foil for grounding.

26. An inspection apparatus according to claim 24, wherein the at least one expansible bellow comprises a plurality of expansible bellows, the at least one measuring element comprises a plurality of measuring elements, and the probe body includes covers configured to cover respective ones of the plurality of measuring elements as the plurality of expansible bellows contracts.

27. An inspection apparatus according to claim 26, further comprising:

means for alternately using different ones of the plurality of measuring elements to obtain the data.

28. An inspection apparatus according to claim 15, further comprising:

a circumferential moving apparatus including a moving section configured to move the arm body along a circumference of the cylindrical rotor body.

29. An inspection apparatus according to claim 28, wherein the circumferential moving apparatus comprises:

a roller chain secured on the circumference of the cylindrical rotor body;

a sprocket engaging the roller chain;

a first driver configured to rotate the sprocket; and a second cable wound on the circumference of the cylindrical rotor body and fastening a moving section of the circumferential moving apparatus against the roller chain.

30. An inspection apparatus according to claim 28, further comprising:

means for setting an original position of the arm body along an axis of the cylindrical rotor body and an original position of the circumferential moving apparatus along the circumference of the cylindrical rotor body.

31. An inspection apparatus according to claim 28, wherein the circumferential moving apparatus comprises:

means for determining a location where the at least one measuring element is inserted into the gap.

32. An inspection apparatus according to claim 28, wherein the circumferential moving apparatus comprises:

means for preventing the moving section of the circumferential moving apparatus from moving while the at least one measuring element is projected to the measuring position.

33. An inspection apparatus according to claim 28, wherein the circumferential moving apparatus comprises:

a belt member secured on the circumference of the cylindrical rotor body, the belt member including a toothed belt;

a tire pulley engaging with the toothed belt;

a first driver configured to rotate the tire pulley; and a second cable wound on the circumference of the cylindrical rotor body, the second cable fastening the moving section of the circumferential moving apparatus against the belt member.

34. An inspection apparatus according to claim 33, wherein the belt member comprises:

at least one first belt attached to the belt member; and at least one first ratchet configured to fasten the belt, thereby to secure the belt member on the circumference of the cylindrical rotor body.

35. An inspection apparatus according to claim 34, further comprising:

a second belt attached to one end of the second cable; and a second ratchet is attached to the other end of the second cable.

36. An inspection apparatus according to claim 34, further comprising:

a tension regulator configured to regulate tension of the second cable.

37. An inspection apparatus for inspecting performance of an electric rotating machine including a cylindrical rotor body and a stator body, the stator body covering an outer peripheral portion of the rotor body to form a gap between the cylindrical rotor body and the stator body, the stator body including a plurality of stator windings arranged radially outward of the rotor body, the inspection apparatus comprising:

at least one measuring element configured to obtain data associated with the stator winding;

a probe body supporting the at least one measuring element;

an arm body supporting the probe body and comprising a rod; and means for inserting the at least one measuring element supported by the probe body through the gap along an axis of the cylindrical rotor body.

38. An inspection apparatus according to claim 37, wherein the inserting means comprises:

means for causing the probe body supported by the rod to freely slide in the axial direction and the radial direction of the electric rotating machine; and means for positioning the probe body supported by the rod along the circumferential direction of the electric rotating machine.

39. An inspection apparatus according to claim 37, wherein said rod comprises a bar.

* * * * *